(12) United States Patent
Tomiyasu et al.

(10) Patent No.: US 8,580,623 B2
(45) Date of Patent: Nov. 12, 2013

(54) THIN FILM TRANSISTOR SUBSTRATE AND DISPLAY DEVICE INCLUDING THE SAME, AND METHOD FOR MANUFACTURING THIN FILM TRANSISTOR SUBSTRATE

(75) Inventors: Kazuhide Tomiyasu, Osaka (JP); Tomohiro Kimura, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/885,768

(22) PCT Filed: Nov. 10, 2011

(86) PCT No.: PCT/JP2011/006295
§ 371 (c)(1),
(2), (4) Date: May 16, 2013

(87) PCT Pub. No.: WO2012/066755
PCT Pub. Date: May 24, 2012

(65) Prior Publication Data
US 2013/0234137 A1 Sep. 12, 2013

(30) Foreign Application Priority Data
Nov. 17, 2010 (JP) .................. 2010-257067

(51) Int. Cl.
*H01L 29/786* (2006.01)
*H01L 21/336* (2006.01)
*G02F 1/1368* (2006.01)
*G09F 9/30* (2006.01)

(52) U.S. Cl.
USPC ............ 438/149; 257/E21.411; 257/E29.273; 257/E21.023

(58) Field of Classification Search
CPC .............. H01L 27/1214; H01L 29/458; H01L 29/4908; H01L 29/7869; H01L 27/1225; H01L 21/02565; H01L 21/02554

USPC .......................................................... 438/149
See application file for complete search history.

(56) References Cited

U.S. PATENT DOCUMENTS 7,061,014 B2 * 6/2006 Hosono et al. .................. 257/43
7,465,612 B2 * 12/2008 Chae et al. ..................... 438/149

(Continued)

FOREIGN PATENT DOCUMENTS

JP 06-194689 A 7/1994
JP 06194689 A * 7/1994 ...................... 349/42

(Continued)

OTHER PUBLICATIONS

Official Communication issued in International Patent Application No. PCT/JP2011/006295, mailed on Dec. 20, 2011.

*Primary Examiner* — Kevin Parendo
*Assistant Examiner* — Pauline Vu
(74) *Attorney, Agent, or Firm* — Keating & Bennett, LLP

(57) ABSTRACT

A TFT (20) includes a semiconductor layer (12*s*1) of an oxide semiconductor, a source electrode (13*sd*) and a drain electrode (13*dd*) provided on the semiconductor layer (12*s*1) and separated from each other, a gate insulating film (15) covering a portion of the semiconductor layer between the source electrode (13*sd*) and the drain electrode (13*dd*), a gate electrode (18*gd*) provided over the semiconductor layer (12*s*1) with the gate insulating film (15) being interposed between the gate electrode (18*gd*) and the semiconductor layer (12*s*1). The source electrode (13*sd*) is integrally formed with the source line (13*s*1). The gate electrode (18*gd*) is integrally formed with the gate line (18*g*1). The semiconductor layer (12*s*1) extends below the source line (13*s*1). The entireties of the source line (13*s*1), the source electrode (13*sd*), and the drain electrode (13*dd*) are provided on the semiconductor layer (12*s*1).

4 Claims, 21 Drawing Sheets

(56) References Cited

U.S. PATENT DOCUMENTS

| | | |
|---|---|---|
| 2008/0308826 A1* | 12/2008 | Lee et al. .................. 257/98 |
| 2009/0108256 A1* | 4/2009 | Kwak et al. ................. 257/43 |
| 2010/0224878 A1 | 9/2010 | Kimura |
| 2011/0128275 A1 | 6/2011 | Ueda et al. |
| 2011/0260157 A1 | 10/2011 | Yano et al. |

FOREIGN PATENT DOCUMENTS

| | | |
|---|---|---|
| JP | 2004-355022 A | 12/2004 |
| JP | 2009-054836 A1 | 3/2009 |
| JP | 2010-074148 A | 4/2010 |
| JP | 2010-129556 A | 6/2010 |
| JP | 2010-232651 A | 10/2010 |
| WO | 2008/136505 A1 | 11/2008 |

* cited by examiner (a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

THIN FILM TRANSISTOR SUBSTRATE AND DISPLAY DEVICE INCLUDING THE SAME, AND METHOD FOR MANUFACTURING THIN FILM TRANSISTOR SUBSTRATE

TECHNICAL FIELD

The present invention relates to thin film transistor (hereinafter referred to as TFT) substrates and display devices including the TFT substrates, and methods for manufacturing the TFT substrates. More particularly, the present invention relates to a TFT substrate including a semiconductor layer of an oxide semiconductor and a display device including such a TFT substrate, and a method for manufacturing such a TFT substrate.

BACKGROUND ART

In recent years, for TFT substrates included in display devices such as a liquid crystal display device etc., a TFT including a semiconductor layer of an oxide semiconductor (hereinafter referred to as an oxide semiconductor layer), which has satisfactory characteristics (e.g., high mobility, high reliability, low off current, etc.), has been proposed as a switching element for each pixel, which is the smallest unit of an image, instead of conventional TFTs including a semiconductor layer of amorphous silicon (a-Si).

For example, a typical bottom-gate TFT includes a gate electrode provided on an insulating substrate such as a glass substrate etc., a gate insulating film covering the gate electrode, a semiconductor layer provided on the gate insulating film over the gate electrode, and a source electrode and a drain electrode provided on the gate insulating film, overlapping the semiconductor layer (the source and drain electrodes are separated from each other). A channel region is formed in a portion of the semiconductor layer which is exposed between the source and drain electrodes.

The source and drain electrodes have a predetermined thickness sufficient to reduce the electrical resistance in order to avoid or reduce a signal delay. A threshold voltage for driving the TFT depends on the thickness of the semiconductor layer. As the thickness of the semiconductor layer increases, a gate voltage for driving the TFT proportionately increases. Therefore, the semiconductor layer is formed to have as small a thickness as possible within a range which allows a desired threshold voltage for the TFT, so that the semiconductor layer is thinner than the source and drain electrodes. This structure is similar to that of the TFT including an oxide semiconductor layer.

In the TFT substrate, the TFT is covered by a protection insulating film, and a pixel electrode formed on the insulating film is connected to the drain electrode through a contact hole formed in the protection insulating film.

Such a TFT substrate including the bottom-gate TFT may be manufactured as follows, for example. A film to be etched is formed on an insulating substrate by sputtering, chemical vapor deposition (hereinafter referred to as CVD), etc. A photosensitive resin film is formed by an application technique on the film to be etched. The photosensitive resin film is exposed to light through a photomask and then developed to form a resist pattern. The film to be etched which has been exposed through the resist pattern is patterned by dry etching or wet etching. This series of steps is repeatedly performed.

Specifically, a commonly used method for manufacturing the TFT substrate including the bottom-gate TFT uses five photomasks. In this manufacturing method, for example, a first photomask is used to form the gate electrode on the glass substrate. After formation of the gate insulating film covering the gate electrode, a second photomask is used to form the oxide semiconductor layer. Next, a third photomask is used to form the source and drain electrodes. Next, the protection insulating film is formed to cover the source and drain electrodes. A fourth photomask is used to form the contact hole in the protection insulating film. Finally, a fifth photomask is used to form the pixel electrode.

For such a TFT substrate thus manufactured, the cost of preparing, maintaining, and managing as many as five photomasks is required, and in addition, it is necessary to perform a plurality of processes (application, exposure, development, etc.) on the photosensitive resin material during formation of each resist pattern using the corresponding photomask, i.e., a large number of manufacturing steps are required, resulting in a high manufacturing cost. Therefore, TFT structures which require a smaller number of photomasks in manufacture of the TFT substrate have been previously proposed.

For example, Patent Document 1 describes a top-gate TFT, which includes a source electrode and a drain electrode provided on an upper surface of a base substrate and separated from each other, an oxide semiconductor layer provided between the source and drain electrodes and covering side end portions facing each other of the source and drain electrodes, and a gate insulating film and a gate electrode successively formed on an upper surface of the oxide semiconductor layer, and that has a configuration in which the oxide semiconductor layer, the gate insulating film, and the gate electrode have the same contour pattern projected on the upper surface of the base substrate. Patent Document 1 also shows that the configuration makes it possible to form the TFT using two photomasks, i.e., a first photomask for forming the source and drain electrodes and a second photomask for forming the oxide semiconductor layer, the gate insulating film, and the gate electrode.

CITATION LIST

Patent Document

PATENT DOCUMENT 1: Japanese Patent Publication No. 2010-129556

SUMMARY OF THE INVENTION

Technical Problem

However, in the TFT of Patent Document 1, the oxide semiconductor layer covers the side end portions of the source and drain electrodes having a relatively large thickness, and therefore, when the oxide semiconductor layer is formed, the oxide semiconductor layer may fail to completely cover the step portions between the base substrate surface and the source and drain electrodes (i.e., a break may occur in the oxide semiconductor layer at the step portions), so that a connection failure may occur between the oxide semiconductor layer and the source and drain electrodes. In this case, the TFT does not operate normally, leading to a decrease in manufacturing efficiency and yield of a TFT substrate including the TFTs.

The present invention has been made in view of the above problems. It is an object of the present invention to provide a TFT including an oxide semiconductor which has satisfactory characteristics and can reliably operate normally, and manufacture a TFT substrate including the TFTs using a smaller number of photomasks at lower cost.

Solution to the Problem

To achieve the object, the present invention provides a configuration of a TFT in which a source electrode and a drain electrode are provided on an oxide semiconductor layer, and both the electrodes and the oxide semiconductor layer can be formed using a single multitone mask.

Specifically, the present invention is directed to a TFT substrate including a base substrate, a plurality of source lines provided on the base substrate and extending in parallel to each other, a plurality of gate lines extending in parallel to each other in a direction intersecting the source lines, and a TFT and a pixel electrode provided for each of intersection portions of the source lines and the gate lines, a display device including the TFT substrate, and a method for manufacturing the TFT substrate. The means for solution will be described hereinafter.

Specifically, a first invention is the TFT substrate in which each of the TFTs includes an oxide semiconductor layer, a source electrode and a drain electrode provided on the oxide semiconductor layer and separated from each other, a gate insulating film covering a portion of the oxide semiconductor layer between the source and drain electrodes, and a gate electrode provided over the oxide semiconductor layer with the gate insulating film being interposed between the gate electrode and the oxide semiconductor layer, each of the source electrodes is integrally formed with the corresponding one of the source lines, each of the gate electrodes is integrally formed with the corresponding one of the gate lines, and each of the oxide semiconductor layers extends below the corresponding one of the source lines, and the entirety of each of the source lines, the entirety of each of the source electrodes, and the entirety of each of the drain electrodes are provided on the corresponding one of the oxide semiconductor layers.

A second invention is the TFT substrate of the first invention in which each of the pixel electrodes is connected to a surface of the drain electrode of the corresponding one of the TFTs, and the gate lines and the gate electrodes each have a multilayer structure including a plurality of conductive layers provided one on top of another, the plurality of conductive layers including a conductive layer or layers of the same material as that of the pixel electrodes.

A third invention is the TFT substrate of the first invention in which each of the integral pairs of the gate lines and the gate electrodes, and the gate insulating film which corresponds thereto, have the same shape and are provided, one on top of another, on the base substrate at the same location.

A fourth invention is the TFT substrate of any one of the first to third inventions in which each of the oxide semiconductor layers is formed of an oxide semiconductor of indium gallium zinc oxide (hereinafter referred to as In—Ga—Zn—O).

A fifth invention is a display device including the TFT substrate of any one of the first to fourth inventions.

A sixth invention is a method for manufacturing the TFT substrate of the first invention including a first patterning step of successively forming a semiconductor film of an oxide semiconductor and a first conductive film on the base substrate to form a first multilayer film, forming, on a semiconductor layer formation portion of the first multilayer film, a first resist pattern which is thicker in portions in which the source lines, the source electrodes, and the drain electrodes are to be formed than in other portions, using a multitone mask as a first photomask, and thereafter, patterning the first multilayer film using the first resist pattern as a mask, thereby forming the source lines, and the oxide semiconductor layers each covered by a first conductive layer integrated with the corresponding one of the source lines, and a second patterning step of reducing a thickness of the first resist pattern to expose a portion of the first conductive layer other than the portions in which the source electrodes and the drain electrodes are to be formed while leaving the resist pattern only on the source lines and the portions in which the source and drain electrodes are to be formed, thereby forming a second resist pattern, and thereafter, patterning the first conductive layer using the second resist pattern as a mask, to form the source and drain electrodes, where, after the first and second patterning steps, the gate insulating film, the gate lines, the gate electrodes, and the pixel electrodes are formed.

A seventh invention is the TFT substrate manufacturing method of the sixth invention including a third patterning step of, after the second patterning step, forming the gate insulating film to cover the oxide semiconductor layers, the source lines, the source electrodes, and the drain electrodes, and forming a third resist pattern on portions of the gate insulating film other than portions each overlapping at least a portion of the corresponding one of the drain electrodes, using the second photomask, and thereafter, patterning the gate insulating film using the third resist pattern as a mask, to form, in the gate insulating film, contact holes reaching the respective corresponding drain electrodes, a fourth patterning step of successively forming a second conductive film and a third conductive film to cover the gate insulating film, thereby forming a second multilayer film, forming a fourth resist pattern which is thicker in portions in which the gate lines and the gate electrodes are to be formed than in other portions, using a multitone mask as a third photomask, on portions of the second multilayer film in which the gate lines, the gate electrodes, and the pixel electrodes are to be formed, and thereafter, patterning the second multilayer film using the fourth resist pattern as a mask, to form the gate lines, the gate electrodes, and the pixel electrodes covered by the second conductive layer and connected through the contact holes to the drain electrodes, and a fifth patterning step of reducing a thickness of the fourth resist pattern to expose the second conductive layer on the pixel electrodes while leaving the resist pattern only on the gate lines and the gate electrodes, thereby forming a fifth resist pattern, and thereafter, removing the second conductive layer using the fifth resist pattern as a mask, to expose the pixel electrodes.

An eighth invention is the TFT substrate manufacturing method of the sixth invention including a third patterning step of, after the second patterning step, successively forming the gate insulating film and a second conductive film to cover the oxide semiconductor layers, the source lines, the source electrodes, and the drain electrodes, thereby forming a second multilayer film, and forming a third resist pattern on portions of the second multilayer film on which the gate lines and the gate electrodes are to be formed, using a second photomask, and thereafter, patterning the second multilayer film using the third resist pattern as a mask, to form each of the integral pairs of the gate lines and the gate electrodes, and the gate insulating film which corresponds thereto, one on top of another, on the base substrate at the same location and in the same shape, and a fourth patterning step of forming a third conductive film to cover the gate lines, the gate electrodes, and the gate insulating film, and forming a fourth resist pattern on portions of the third conductive film on which the pixel electrodes are to be formed, using a third photomask, and thereafter, patterning the third conductive film using the fourth resist pattern as a mask, to form the pixel electrodes.

Advantageous Effects

Next, advantageous effects of the present invention will be described.

In the first invention, the entirety of each of the source lines, the entirety of each of the source electrodes, and the entirety each of the drain electrodes are provided on the corresponding one of the oxide semiconductor layers. Therefore, it is not likely that a break occurs in the oxide semiconductor layer during the formation, so that a connection failure occurs between the source electrode and the drain electrode. Therefore, both the electrodes and the oxide semiconductor layer can be reliably connected together. In addition, a single multitone mask can be used both as a photomask for forming the source lines, the source electrodes, and the drain electrodes and as a photomask for forming the oxide semiconductor layers.

Specifically, as in the sixth invention, a first resist pattern which is thicker in portions in which source lines, source electrodes, and drain electrodes are to be formed than in other portions is formed, using a multitone mask as a first photomask, on a semiconductor layer formation portion of a first multilayer film which is formed by successively forming a semiconductor film of an oxide semiconductor and a first conductive film. Thereafter, the first multilayer film is patterned using the first resist pattern as a mask, thereby forming source lines, and oxide semiconductor layers each covered by a first conductive layer integrated with the corresponding one of the source lines. Next, a thickness of the first resist pattern is reduced to expose a portion of the first conductive layer other than portions in which source electrodes and drain electrodes are to be formed while leaving the resist pattern only on the source lines and portions in which source and drain electrodes are to be formed, thereby forming a second resist pattern. Thereafter, the first conductive layer is patterned using the second resist pattern as a mask, to form source and drain electrodes. Thus, the two resist patterns can be formed by the single photomask (multitone mask), whereby the number of photomasks required to manufacture the TFT substrate can be reduced.

Therefore, the TFT formed of an oxide semiconductor having satisfactory characteristics can reliably operate normally, and the TFT substrate including the TFTs can be manufactured using a smaller number of photomasks at lower cost.

In the second invention, a multilayer structure is provided which includes a plurality of conductive layers provided one on top of another, the plurality of conductive layers including a conductive layer or layers in which gate lines and gate electrodes are each formed of the same material as that of pixel electrodes. The TFT substrate of this configuration can be manufactured using a single multitone mask serving both as a photomask for forming the gate lines and the gate electrodes and as a photomask for forming the pixel electrodes.

Specifically, as in the seventh invention, a fourth resist pattern which is thicker in portions in which gate lines and gate electrodes are to be formed than in other portions is formed using a multitone mask as a third photomask on portions of a second multilayer film in which gate lines, gate electrodes, and pixel electrodes are to be formed (the second multilayer film is formed by successively forming a second conductive film and a third conductive film on a gate insulating film. Thereafter, the second multilayer film is patterned using the fourth resist pattern as a mask, to form the gate lines, the gate electrodes, and the pixel electrodes covered by the second conductive layer. Thereafter, a thickness of the fourth resist pattern is reduced to expose the second conductive layer on the pixel electrodes while leaving the resist pattern only on the gate lines and the gate electrodes, thereby forming a fifth resist pattern. Thereafter, the second conductive layer is removed using the fifth resist pattern as a mask, to expose the pixel electrodes. Thus, the two resist patterns can be formed by the single photomask (multitone mask), whereby the number of photomasks required to manufacture the TFT substrate can be further reduced.

In the third invention, each of the integral pairs of the gate lines and the gate electrodes, and the gate insulating film which corresponds thereto, have the same shape and are provided, one on top of another, on the base substrate at the same location. The TFT substrate of this configuration can be manufactured by forming the gate lines, the gate electrodes, and the gate insulating film using a single photomask.

Specifically, as in the eighth invention, a third resist pattern is formed on portions of a second multilayer film on which gate lines, gate electrodes, and a gate insulating film are to be formed (the second multilayer film is formed by successively forming an insulating film and a second conductive film), using a second photomask. Thereafter, the second multilayer film is patterned using the third resist pattern as a mask, to form each of the integral pairs of the gate lines and the gate electrodes, and the gate insulating film which corresponds thereto, one on top of another, on the base substrate at the same location and in the same shape. Thus, by using a single photomask, the gate lines, the gate electrodes, and the gate insulating film (i.e., different layers) can be simultaneously or successively formed together, and therefore, the number of photomasks required to manufacture the TFT substrate can be further reduced.

In the fourth invention, each of the oxide semiconductor layers is formed of an In—Ga—Zn—O oxide semiconductor. Therefore, in each of the TFTs, satisfactory specific characteristics (high mobility, high reliability, and low off current) can be obtained. In the fifth invention, in the TFT substrates of the first to fourth inventions, a TFT formed of an oxide semiconductor having satisfactory characteristics can reliably operate normally, and the TFT substrate including the TFTs can be manufactured using a smaller number of photomasks at lower cost. As a result, a liquid crystal display device can also be manufactured at lower cost without a decrease in manufacturing efficiency and yield.

Advantages of the Invention

In the present invention, the entirety of each of source lines, the entirety of each of source electrodes, and the entirety each of drain electrodes are provided on the corresponding one of oxide semiconductor layers. Therefore, a TFT formed of an oxide semiconductor having satisfactory characteristics can reliably operate normally, and a TFT substrate including the TFTs can be manufactured using a smaller number of photomasks at lower cost. As a result, a TFT substrate, and in addition, a liquid crystal display device can be manufactured at lower cost without a decrease in manufacturing efficiency and yield.

DESCRIPTION OF EMBODIMENTS

Embodiments of the present invention will be described in detail hereinafter with reference to the accompanying drawings. Note that the present invention is not limited to the embodiments below.

First Embodiment of the Invention

Figure 1:
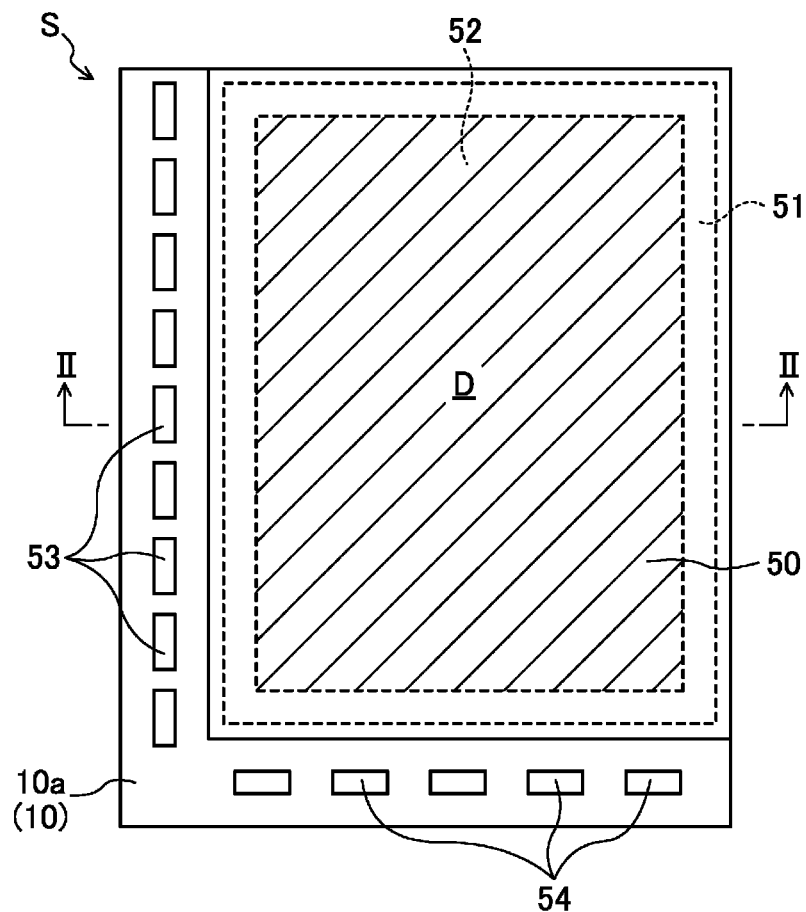
FIG. 1 is a plan view schematically showing a liquid crystal display device according to a first embodiment.
Figure 2:
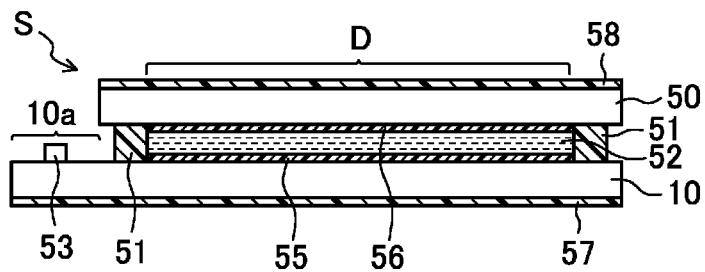
FIG. 2 is a cross-sectional view schematically showing a cross-sectional structure, taken along line II-II of FIG. 1.

FIG. 1 is a plan view schematically showing a liquid crystal display device S according to a first embodiment. FIG. 2 is a cross-sectional view schematically showing a cross-sectional structure, taken along line II-II of FIG. 1. Note that, in FIG. 1, a polarizing plate 58 of FIG. 2 is not shown.

<Configuration of Liquid Crystal Display Device S>

The liquid crystal display device S includes a TFT substrate 10 and a counter substrate 50 which face each other, a sealing member 51 in the shape of a rectangular frame which bonds the TFT substrate 10 and the counter substrate 50 together at their outer circumferential edge portions, and a liquid crystal layer 52 enclosed between the TFT substrate 10 and the counter substrate 50 inside the sealing member 51.

The liquid crystal display device S is of the transmission type. The liquid crystal display device S has a display region D in which the TFT substrate 10 and the counter substrate 50 overlap and which is located inside the sealing member 51, i.e., a region in which the liquid crystal layer 52 is provided. Image display is performed in the display region D. The TFT substrate 10 has a terminal region 10a having, for example, an L-shape which is provided outside the display region D, extending from the counter substrate 50. The display region D, which has, for example, a rectangular shape, includes a plurality of pixels (not shown, each pixel is the smallest unit of an image) arranged in a matrix. On the other hand, a plurality of gate driver integrated circuit (hereinafter referred to as IC) chip 53 are mounted on one side (left side in FIG. 1) of the terminal region 10a with an anisotropic conductive film (hereinafter referred to as ACF) being interposed between each gate drive IC chip 53 and the TFT substrate 10, and a plurality of source driver IC chips 54 are provided on another side (lower side in FIG. 1) of the terminal region 10a with an ACF being interposed between each source driver IC chip 54 and the TFT substrate 10. In addition, an interconnection substrate (not shown) is mounted in the terminal region 10a. A display signal is supplied from an external circuit via the interconnection substrate to the IC chips 53 and 54 and the display region D.

As shown in FIG. 2, the TFT substrate 10 and the counter substrate 50, which have, for example, a rectangular shape, include respective alignment films 55 and 56 on inner surfaces thereof facing each other, and respective polarizing plates 57 and 58 on outer surfaces thereof. The liquid crystal layer 52 is formed of, for example, a nematic liquid crystal material, which has electro-optic properties.

<Configuration of TFT Substrate 10>

Figure 3:
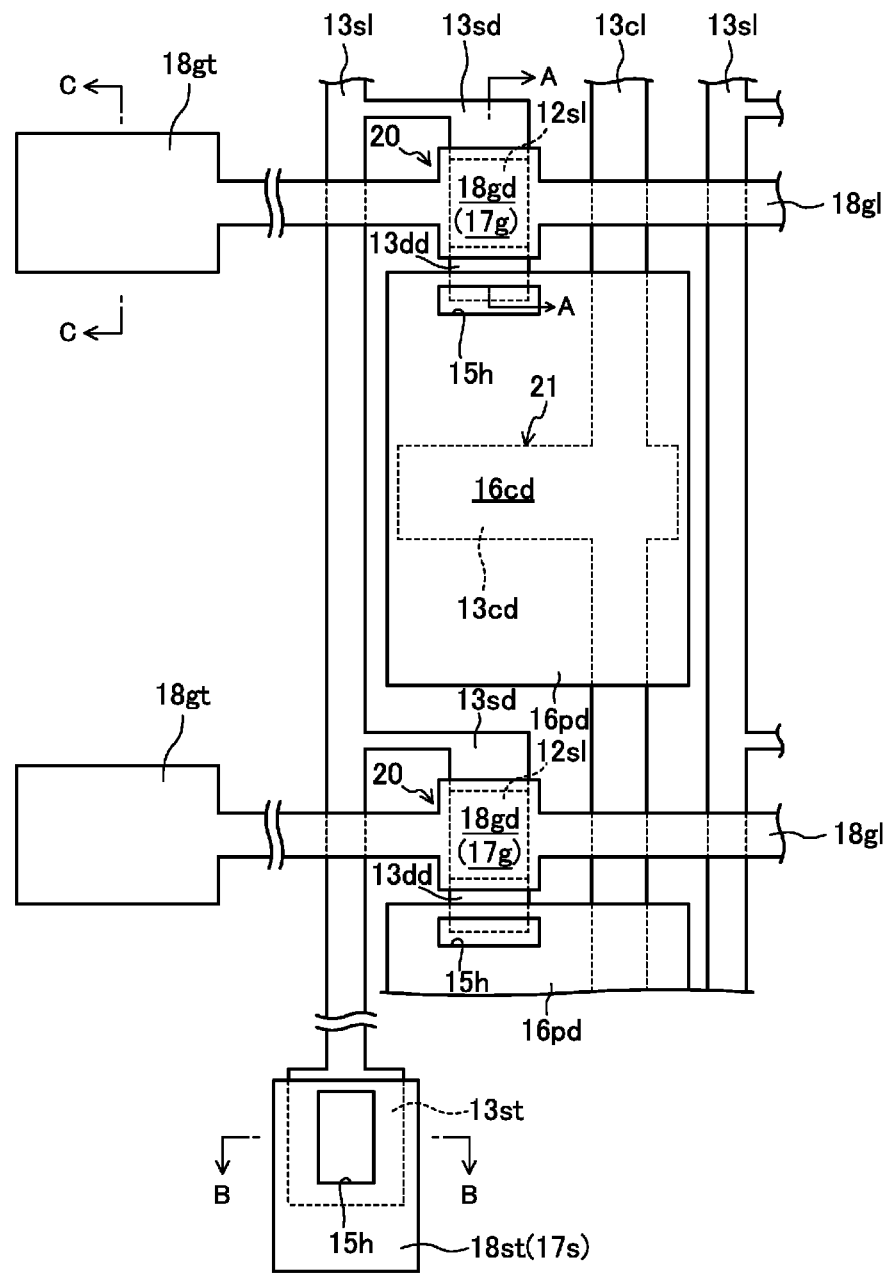
FIG. 3 is a plan view schematically showing a configuration of one pixel and terminal portions of lines or interconnects of a TFT substrate according to the first embodiment.
Figure 4:
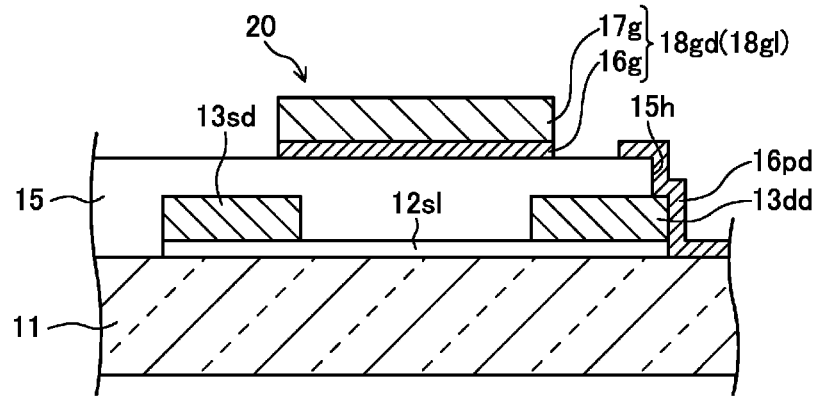
FIG. 4(a) is a cross-sectional view showing a cross-sectional structure, taken along line A-A of FIG. 3.
FIG. 4(b) is a cross-sectional view showing a cross-sectional structure, taken along line B-B of FIG. 3.
FIG. 4(c) is a cross-sectional view showing a cross-sectional structure, taken along line C-C of FIG. 3.
Figure 4:
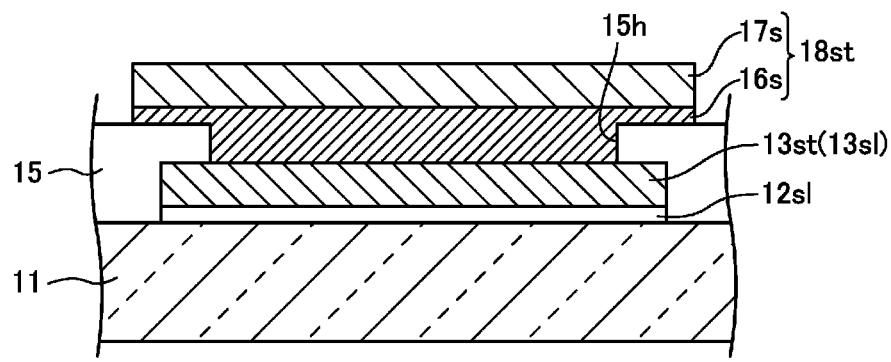
Figure 4:
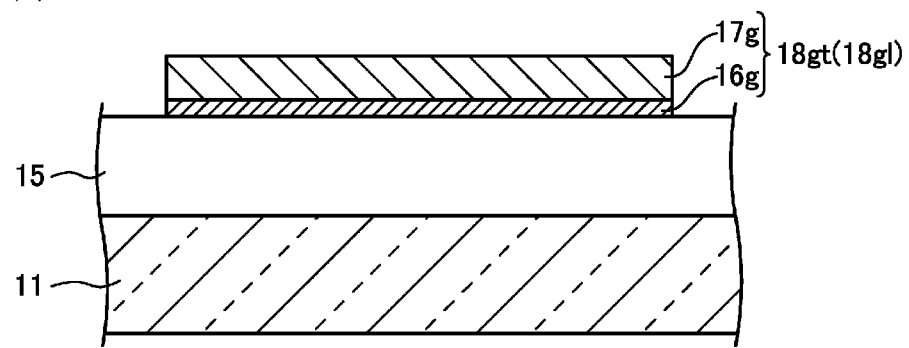

A schematic configuration of the TFT substrate 10 is shown in FIGS. 3 and 4. FIG. 3 is a plan view showing a configuration of one pixel and terminal portions of lines or interconnects of the TFT substrate 10. FIG. 4(a) is a cross-sectional view showing a cross-sectional structure, taken along line A-A of FIG. 3. FIG. 4(b) is a cross-sectional view showing a cross-sectional structure, taken along line B-B of FIG. 3. FIG. 4(c) is a cross-sectional view showing a cross-sectional structure, taken along line C-C of FIG. 3.

The TFT substrate 10 has an insulating substrate (base substrate) 11 shown in FIGS. 4(a)-4(c). As shown in FIG. 3, on the insulating substrate 11 in the display region D, provided are a plurality of source lines 13s1 extending in parallel to each other, holding capacitor lines 13c1 extending along the respective corresponding source lines 13s1 (one holding capacitor line 13c1 is provided for each source line 13s1), and a plurality of gate lines 18g1 extending in parallel to each other in a direction intersecting the source lines 13s1 and the holding capacitor lines 13c1. Here, the source lines 13s1 and the gate lines 18g1 intersect with a gate insulating film 15 being interposed therebetween, to form a grid pattern with each grid mesh or interstice corresponding to a pixel. The holding capacitor lines 13c1 each extend over a plurality of pixels (i.e., across each of the pixels) arranged in a direction in which the corresponding source line 13s1 extends.

Note that the insulating substrate 11 may be, for example, a glass substrate, a silicon substrate, a heat-resistant plastic substrate, a resin substrate, etc. In particular, the plastic substrate may be preferably formed of polyethylene terephthalate (PET), polyethylene naphthalate (PEN), or polyether sulphone (PES). The resin substrate may be preferably formed of acrylic resin or polyimide resin.

The TFT substrate 10 further includes a TFT 20, a pixel electrode 16pd, and a holding capacitor element 21 for each of the intersection portions of the source lines 13s1 and the gate lines 18g1, i.e., for each pixel.

As shown in FIG. 4(a), the TFT 20, which has a top-gate structure, includes an oxide semiconductor layer 12s1 provided on the insulating substrate 11, a source electrode 13sd and a drain electrode 13dd provided on the oxide semiconductor layer 12s1 and separated from each other, a gate insulating film 15 covering a portion of the oxide semiconductor layer between the source electrode 13sd and the drain electrode 13dd, and a gate electrode 18gd provided over the oxide semiconductor layer 12s1 with the gate insulating film 15 being interposed therebetween.

As shown in FIG. 3, the source electrode 13sd is a portion laterally protruding to the right of the source line 13s1 at the corresponding intersection portion. The source electrode 13sd is integrally formed with the source line 13s1. The source line 13s1 and the source electrode 13sd are formed of, for example, a metal (e.g., aluminum (Al), tungsten (W), molybdenum (Mo), tantalum (Ta), copper (Cu), chromium (Cr), titanium (Ti), etc.), or an alloy or nitride thereof, etc.

The oxide semiconductor layer 12s1, which is formed of, for example, an amorphous In—Ga—Zn—O oxide semiconductor, extends below the source line 13s1 at the corresponding intersection portion. As shown in FIG. 4(a), the entire source electrode 13sd and drain electrode 13dd are provided on the oxide semiconductor layer 12s1. As shown in FIG. 4(b), the entire source line 13s1 is also provided on the oxide semiconductor layer 12s1. With this configuration, a break does not occur in the oxide semiconductor layer 12s1 during the formation, i.e., a connection failure does not occur between the source electrode 13sd and the drain electrode 13dd, and therefore, both the electrodes 13sd and 13dd can be reliably connected to the oxide semiconductor layer 12s1. In addition, as described in detail below, a single multitone mask can be used both as a photomask for forming the source line 13s1, the source electrode 13sd, and the drain electrode 13dd and as a photomask for forming the oxide semiconductor layer 12s1.

Note that the oxide semiconductor layer 12s1 may be formed of, for example, indium gallium zinc oxide (InGaO$_3$(ZnO)$_5$), magnesium zinc oxide (Mg$_x$Zn$_{1-x}$O), cadmium zinc oxide (Cd$_x$Zn$_{1-x}$O), cadmium oxide (CdO), etc., instead of the In—Ga—Zn—O oxide semiconductor. Alternatively, the oxide semiconductor layer 12s1 may be formed of zinc oxide (ZnO) doped with one or more impurity elements of the group 1 elements, the group 13 elements, the group 14 elements, the group 15 elements, or the group 17 elements in the amorphous state, the polycrystalline state, or the microcrystalline state, which includes a mixture of the amorphous state and the polycrystalline state. Alternatively, the oxide semiconductor layer 12s1 may be formed of zinc oxide (ZnO) which is not doped with an impurity element.

The gate insulating film 15 is provided on substantially the entire substrate surface, and is shared by the TFTs 20. As shown in FIG. 3, a contact hole 15h through which a portion of the drain electrode 13dd is exposed is formed in the gate insulating film 15 in each TFT 20. As shown in FIG. 4(a), each pixel electrode 16pd is formed on the gate insulating film 15 and is connected via the contact hole 15h to a surface of the drain electrode 13dd of the corresponding TFT 20. The pixel electrodes 16pd are formed of, for example, a transparent conductive material, such as indium tin oxide (hereinafter referred to as ITO), indium zinc oxide (hereinafter referred to as IZO), etc.

The gate electrode 18gd is a portion of the gate line 18g1 at the corresponding intersection portion, and is integrally formed with the gate line 18g1. The gate line 18g1 and the gate electrode 18gd have a multilayer structure including a transparent conductive layer 16g and a light-blocking metal layer 17g. The transparent conductive layer 16g and the pixel electrode 16pd are formed of the same material (e.g., ITO or IZO). The light-blocking metal layer 17g is formed of, for example, a metal (e.g., aluminum (Al), tungsten (W), molybdenum (Mo), tantalum (Ta), chromium (Cr), titanium (Ti), copper (Cu), etc.), or an alloy or nitride thereof, etc. With this configuration, as described in detail below, a single multitone mask can be used both as a photomask for forming the gate line 18g1 and the gate electrode 18gd and as a photomask for forming the pixel electrode 16pd.

As shown in FIG. 3, the holding capacitor element 21 has a structure in which the lower electrode 13cd and the upper electrode 16cd face each other with the gate insulating film 15 being interposed therebetween. As shown in FIG. 3, the lower electrode 13*cd* is a laterally protruding portion of the holding capacitor line 13*c*1. The upper electrode 16*cd* is a pixel electrode portion corresponding to the lower electrode 13*cd*. In other words, each pixel electrode 16*pd* also serves as the upper electrode 16*cd* of the corresponding holding capacitor element 21.

Each source line 13*s*1 is extended to the terminal region 10*a* in which the source driver IC chip 54 is mounted, and a leading edge portion in the terminal region 10*a* of the source line 13*s*1 forms a source terminal portion 13*st* shown in FIG. 3. As shown in FIG. 4(*b*), the source terminal portion 13*st* is connected to an island-shaped source connection electrode 18*st* formed on the gate insulating film 15 through the contact hole 15*h* formed in the gate insulating film 15. Similar to the gate line 18*g*1 and the gate electrode 18*gd*, the source connection electrode 18*st* has a multilayer structure including a transparent conductive layer 16*s* and a light-blocking metal layer 17*s*, and is an electrode for electrically connecting to the source driver IC chip 54.

Each gate line 18*g*1 is extended to the terminal region 10*a* in which the gate driver IC chip 53 is mounted, and a leading edge portion in the terminal region 10*a* of the gate line 18*g*1 forms a gate terminal portion 18*gt* shown in FIGS. 3 and 4(*c*). The gate terminal portion 18*gt* forms an electrode for electrically connecting to the gate driver IC chip 53.

Both end portions of each holding capacitor line 13*c*1 are extended to the region in which the sealing member 51 is provided. The end portions are connected to a common interconnect (not shown) so that the holding capacitor line 13*c*1 is electrically connected to a common electrode (described below) of the counter substrate 50 by common transfer, and therefore, a common potential similar to that of the common electrode is applied to the holding capacitor line 13*c*1.

<Configuration of Counter Substrate 50>

Although not shown, the counter substrate 50 includes a black matrix having a grid pattern formed on a base substrate which is an insulating substrate (e.g., a glass substrate etc.) and corresponding to the source lines 13*s*1 and the gate lines 18*g*1, color filters of multiple colors including a red layer, a green layer, and a blue layer which are periodically arranged between grid bars of the black matrix, a common electrode covering the black matrix and the color filters and facing the pixel electrodes 16*pd*, and column-shaped photospacers provided on the common electrode.

<Operation of Liquid Crystal Display Device S>

In the liquid crystal display device S thus configured, in each pixel, when a gate signal is transmitted from the gate driver IC chip 53 through the gate line 18*g*1 to the gate electrode 18*gd*, so that the TFT 20 is turned on, a source signal is transmitted from the source driver IC chip 54 through the source line 13*s*1 to the source electrode 13*sd*, so that predetermined charge is written into both the pixel electrode 16*pd* and the holding capacitor element 21 via the oxide semiconductor layer 12*s*1 and the drain electrode 13*dd*. In this case, a potential difference occurs between each pixel electrode 16*pd* of the TFT substrate 10 and the common electrode of the counter substrate 50, and a predetermined voltage is applied to the liquid crystal layer 52. When the TFT 20 is off, the charge stored in the holding capacitor element 21 prevents or reduces a decrease in the voltage written in the corresponding pixel electrode 16*pd*. Thereafter, in the liquid crystal display device S, in each pixel, the alignment state of liquid crystal molecules is changed by controlling the magnitude of the voltage applied to the liquid crystal layer 52, to adjust the light transmittance of the liquid crystal layer 52, whereby a desired image is displayed.

—Manufacturing Method—

Figure 5:
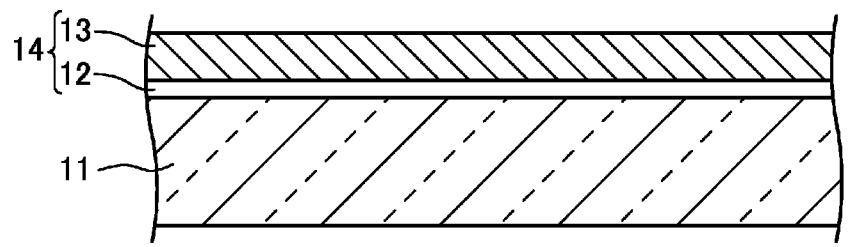
FIG. 5 is a cross-sectional view showing portions corresponding to FIG. 4 of the TFT substrate of the first embodiment in which a first multilayer film has been formed in a first patterning step in a method for manufacturing the TFT substrate.
Figure 5:
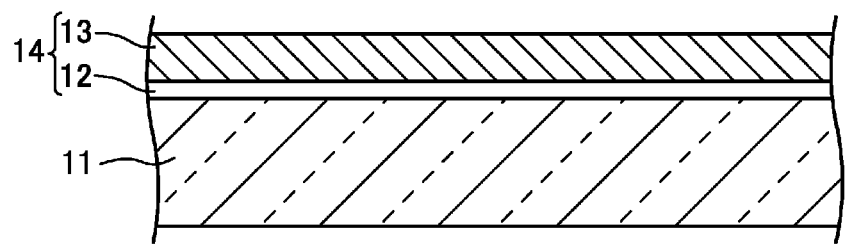
Figure 5:
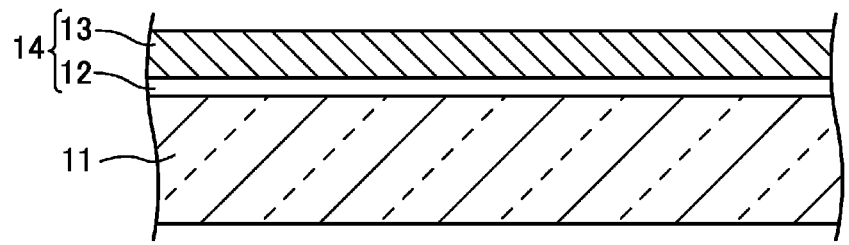
Figure 6:
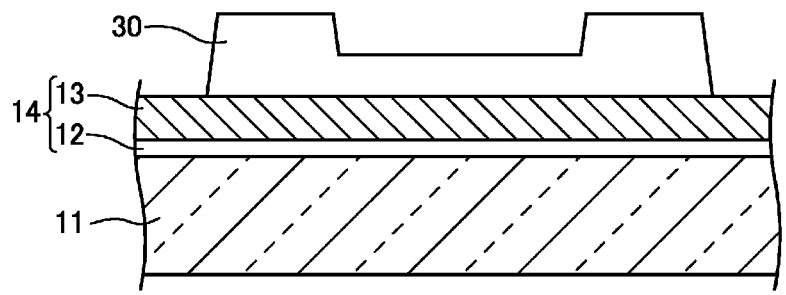
FIG. 6 is a cross-sectional view showing portions corresponding to FIG. 4 of the TFT substrate of the first embodiment in which a first resist pattern has been formed in the first patterning step in the method for manufacturing the TFT substrate.
Figure 6:
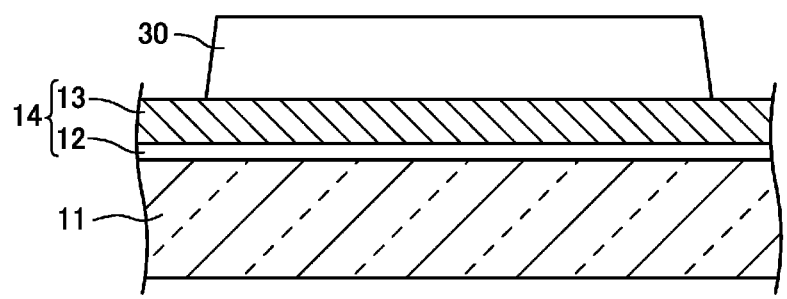
Figure 6:
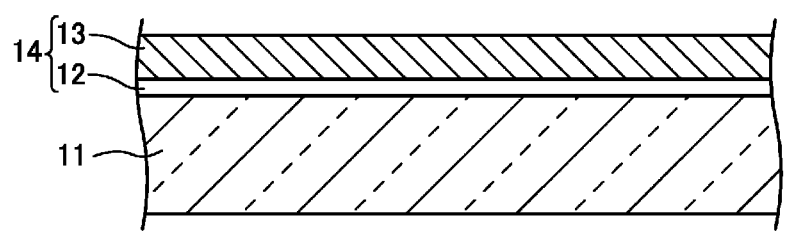
Figure 7:
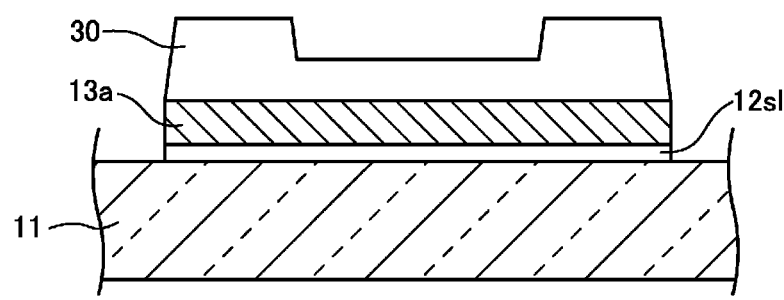
FIG. 7 is a cross-sectional view showing portions corresponding to FIG. 4 of the TFT substrate of the first embodiment in which an oxide semiconductor layer has been formed in the first patterning step in the method for manufacturing the TFT substrate.
Figure 7:
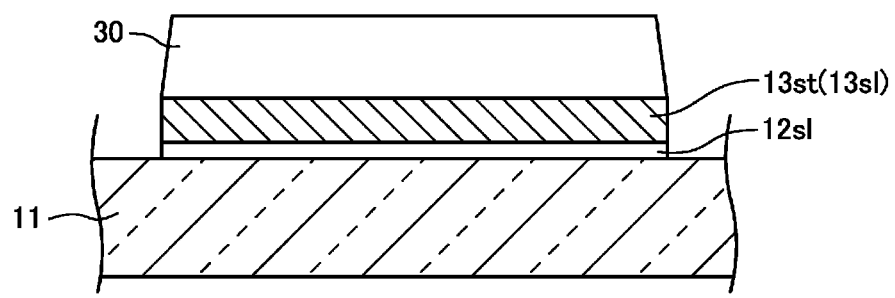
Figure 7:
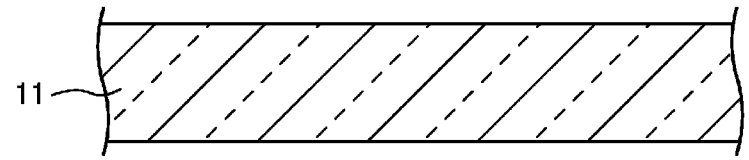
Figure 8:
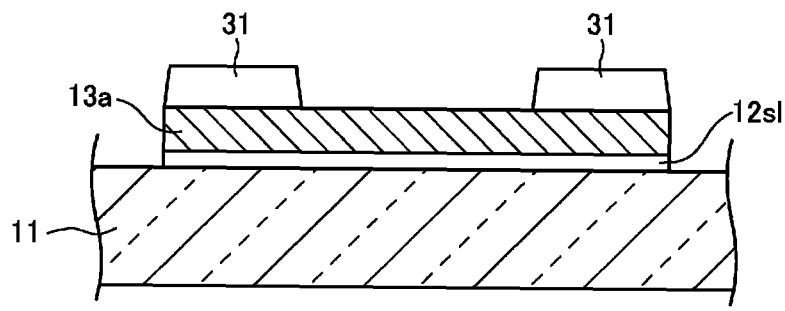
FIG. 8 is a cross-sectional view showing portions corresponding to FIG. 4 of the TFT substrate of the first embodiment in which a second resist pattern has been formed in a second patterning step in the method for manufacturing the TFT substrate.
Figure 8:
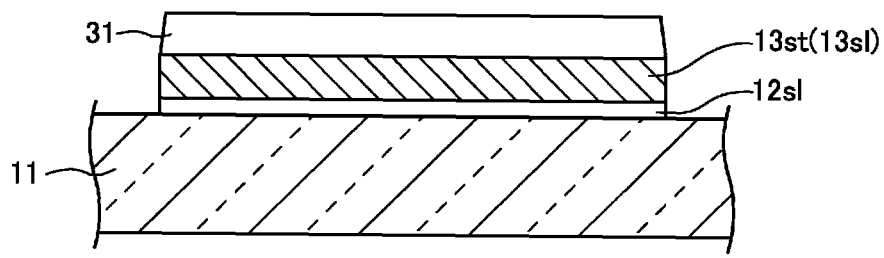
Figure 8:
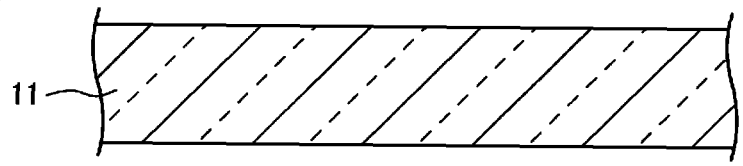
Figure 9:
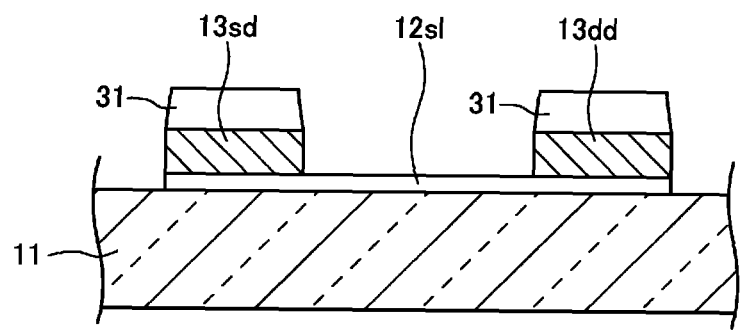
FIG. 9 is a cross-sectional view showing portions corresponding to FIG. 4 of the TFT substrate of the first embodiment in which a source electrode and a drain electrode have been formed in the second patterning step in the method for manufacturing the TFT substrate.
Figure 9:
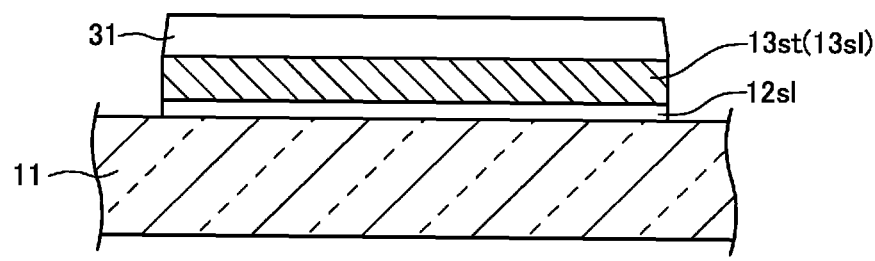
Figure 9:
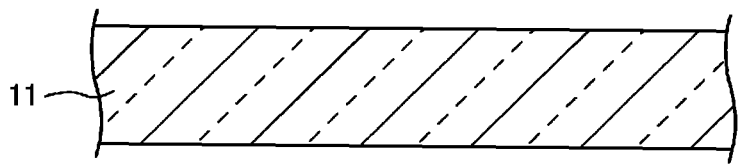
Figure 10:
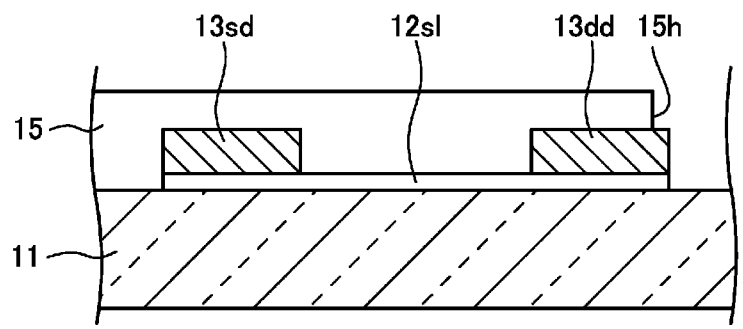
FIG. 10 is a cross-sectional view showing portions corresponding to FIG. 4 of the TFT substrate of the first embodiment in which a gate insulating film has been formed in a third patterning step in the method for manufacturing the TFT substrate.
Figure 10:
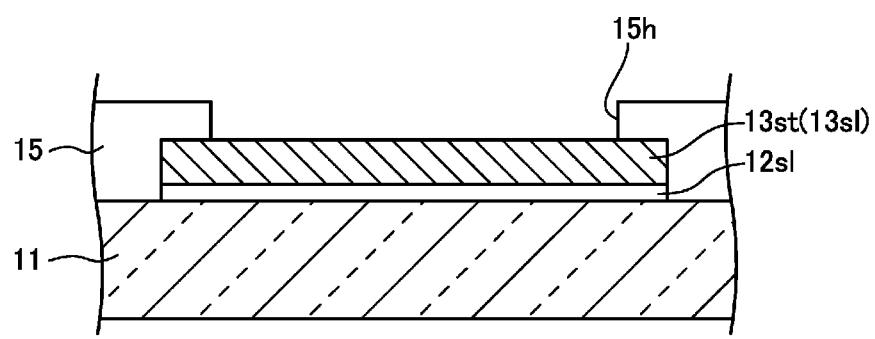
Figure 10:
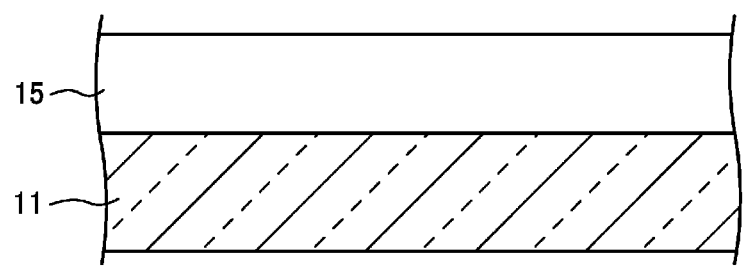
Figure 11:
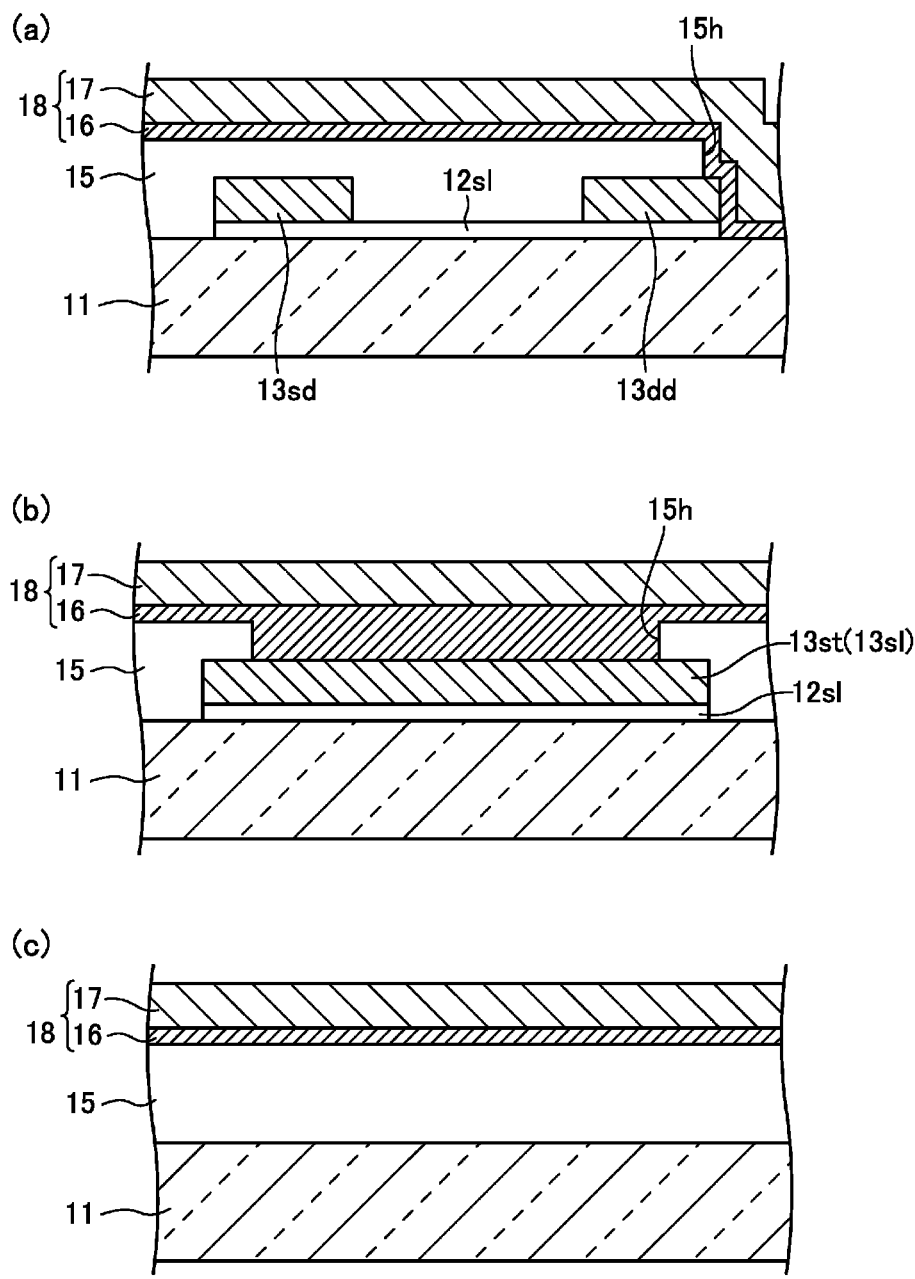
FIG. 11 is a cross-sectional view showing portions corresponding to FIG. 4 of the TFT substrate of the first embodiment in which a second multilayer film has been formed in a fourth patterning step in the method for manufacturing the TFT substrate.
Figure 12:
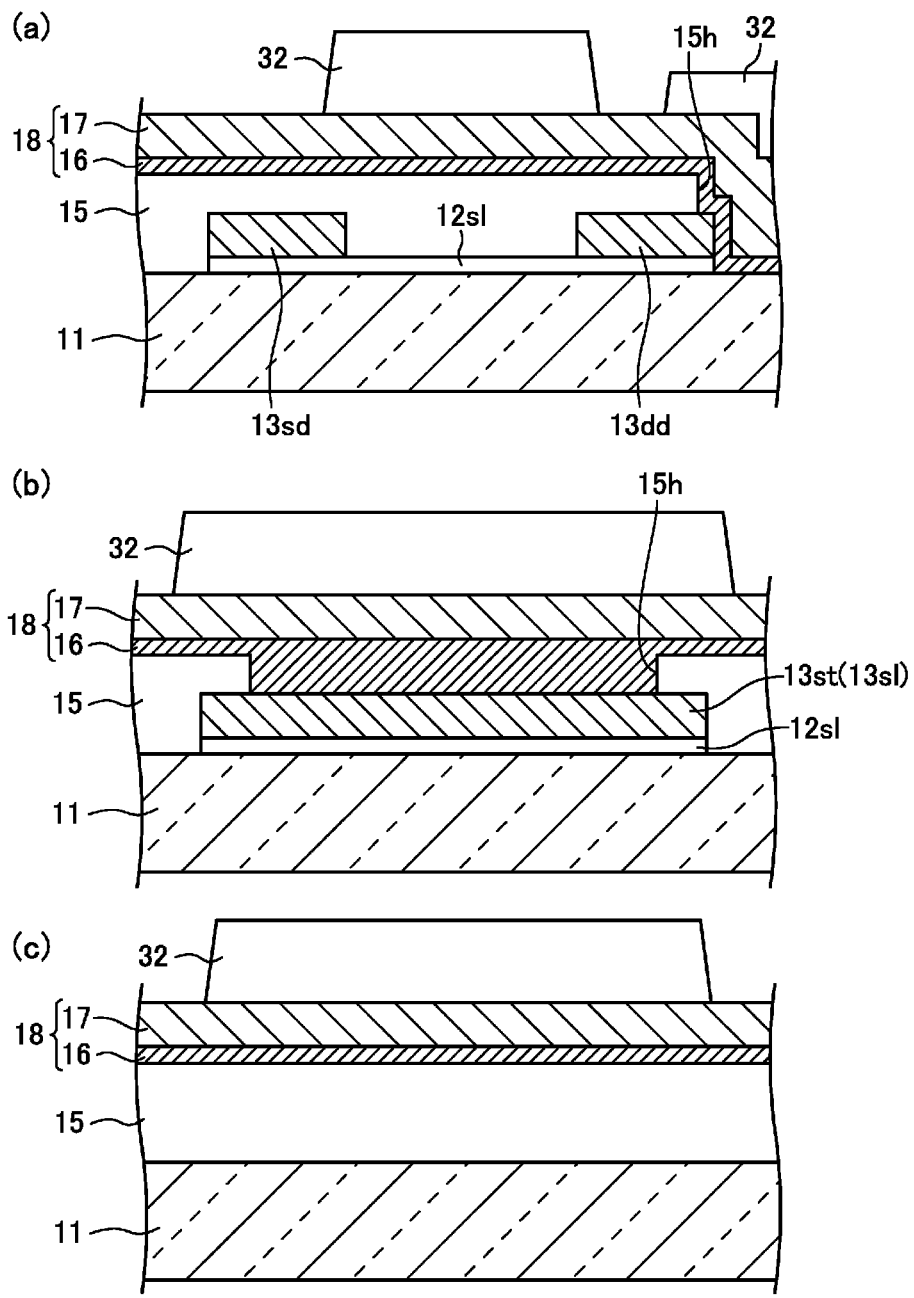
FIG. 12 is a cross-sectional view showing portions corresponding to FIG. 4 of the TFT substrate of the first embodiment in which a fourth resist pattern has been formed in the fourth patterning step in the method for manufacturing the TFT substrate.
Figure 13:
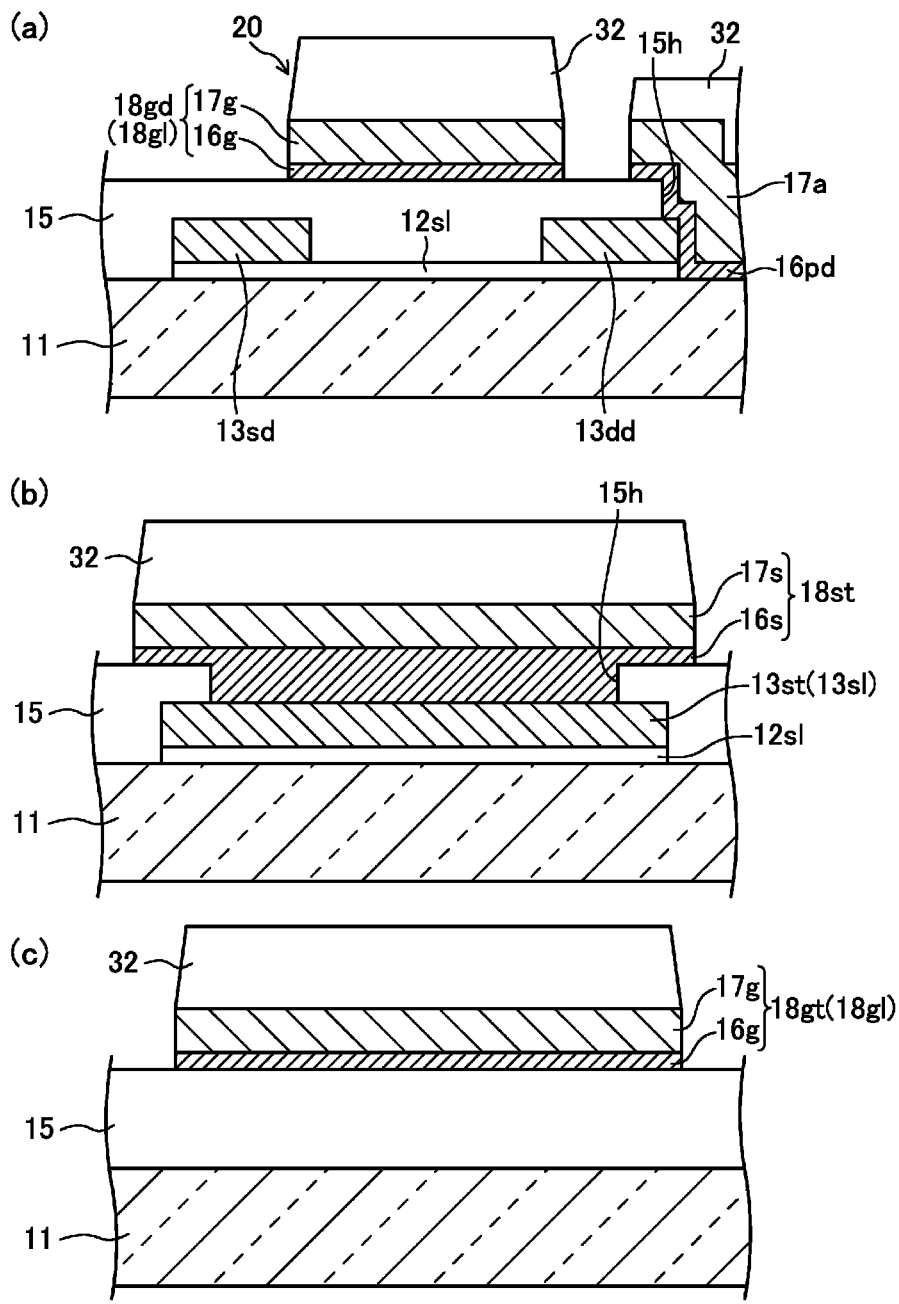
FIG. 13 is a cross-sectional view showing portions corresponding to FIG. 4 of the TFT substrate of the first embodiment in which a gate electrode and a pixel electrode have been formed in the fourth patterning step in the method for manufacturing the TFT substrate.
Figure 14:
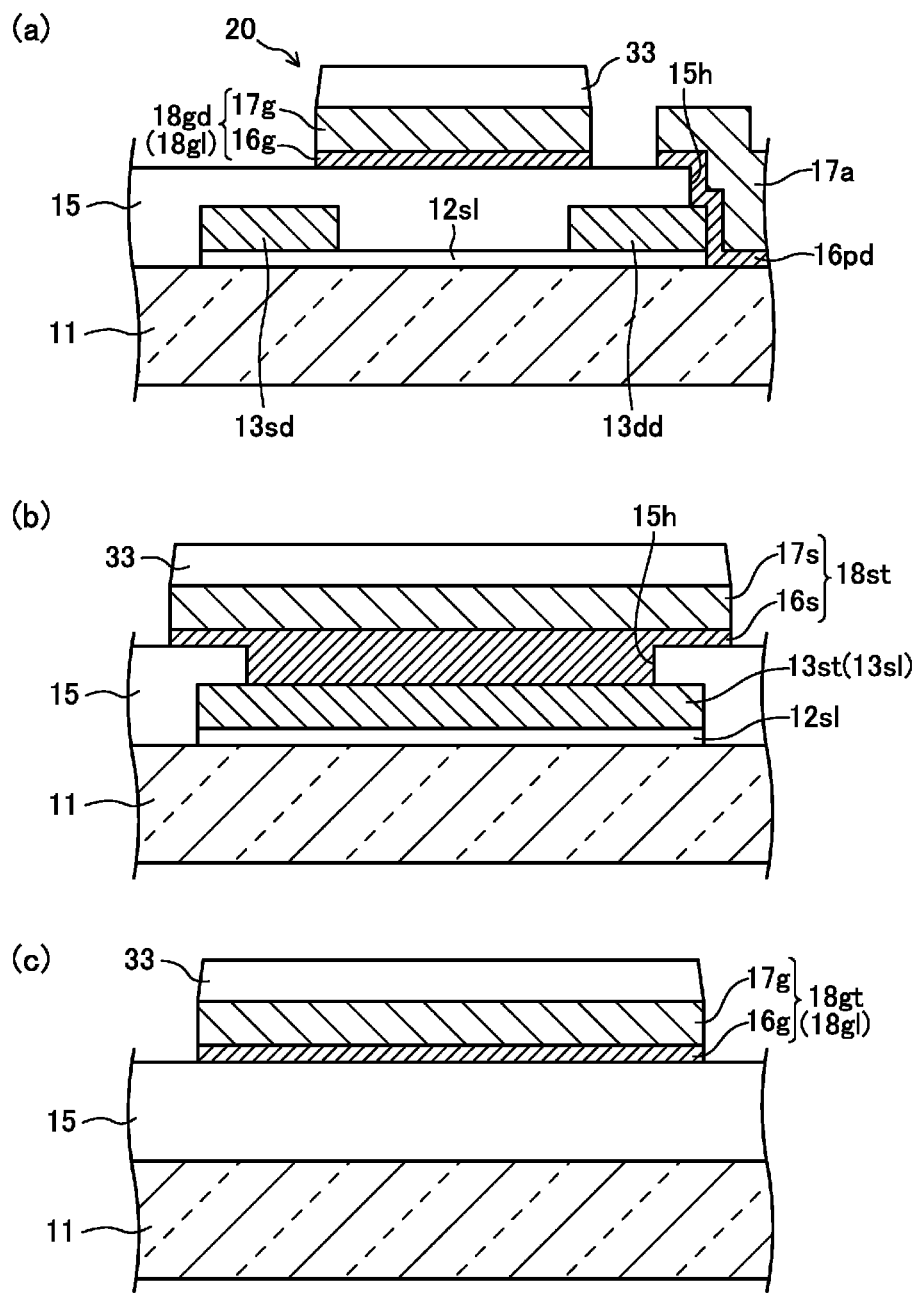
FIG. 14 is a cross-sectional view showing portions corresponding to FIG. 4 of the TFT substrate of the first embodiment in which a fifth resist pattern has been formed in a fifth patterning step in the method for manufacturing the TFT substrate.
Figure 15:
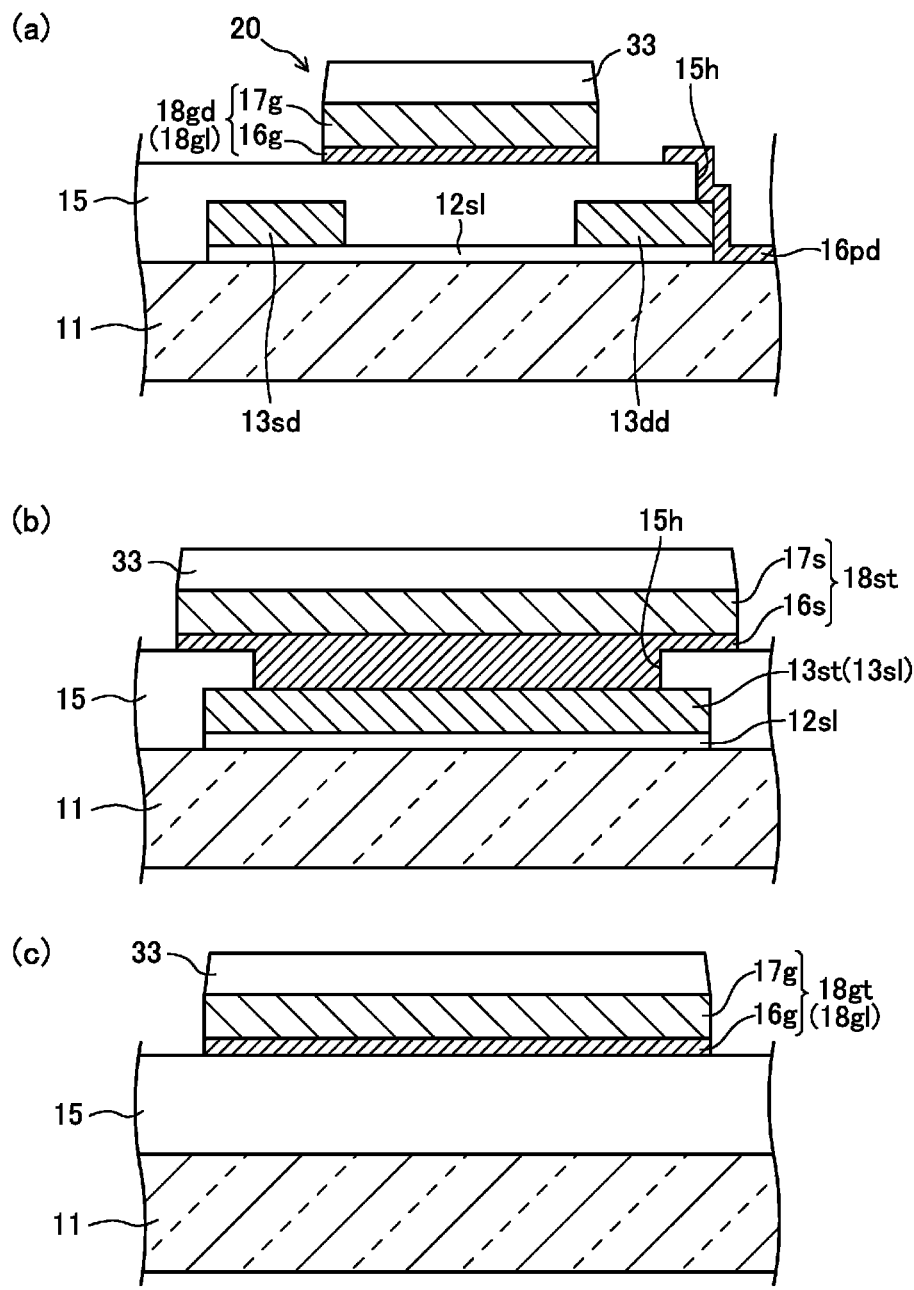
FIG. 15 is a cross-sectional view showing portions corresponding to FIG. 4 of the TFT substrate of the first embodiment in which a pixel electrode has been exposed in the fifth patterning step in the method for manufacturing the TFT substrate.

Next, methods for manufacturing the TFT substrate 10 and the liquid crystal display device S will be described by way of example with reference to FIGS. 5-15. FIGS. 5-15 are cross-sectional views showing steps of the method for manufacturing the TFT substrate 10. Portions (a)-(c) of each figure correspond to FIGS. 4(*a*)-4(*c*), respectively. FIGS. 5-7 are diagrams showing a first patterning step. FIGS. 8 and 9 are diagrams showing a second patterning step. FIG. 10 is a diagram showing a third patterning step. FIGS. 11-13 are diagrams fourth patterning steps. FIGS. 14 and 15 are diagrams showing a fifth patterning step.

The method for manufacturing the liquid crystal display device S includes a TFT substrate manufacturing process, a counter substrate manufacturing process, an attachment process, and a mounting process.

<TFT Substrate Manufacturing Process>

The TFT substrate manufacturing process includes first to fifth patterning steps.

<First Patterning Step>

Initially, an oxide semiconductor film 12 of, for example, In—Ga—Zn—O (e.g., thickness: about 30-100 nm) is formed on a previously prepared insulating substrate 11, such as a glass substrate etc., by sputtering. Next, a metal film of a metal (e.g., aluminum (Al), tungsten (W), molybdenum (Mo), tantalum (Ta), copper (Cu), chromium (Cr), titanium (Ti), etc.) or an alloy or nitride thereof, or a multilayer film including such metal films, is formed as a first conductive film 13 (e.g., thickness: about 200-500 nm) on the oxide semiconductor film 12 by sputtering. As a result, as shown in FIG. 5, a first multilayer film 14 including the oxide semiconductor film 12 and the first conductive film 13 is formed.

Next, as shown in FIG. 6, a first resist pattern 30 which is thicker in portions in which source lines, source electrodes, and drain electrodes are to be formed than in other portions, is formed in portions of the first multilayer film 14 in which a semiconductor layer is to be formed, using, as a first photomask, a halftone or gray-tone mask (multitone mask). Thereafter, as shown in FIG. 7, the first multilayer film 14 is patterned by selective etching using the first resist pattern 30 as a mask to form the source lines 13*s*1, and the oxide semiconductor layer 12*s*1 covered by a first conductive layer 13*a* integrated with the source lines 13*s*1.

<Second Patterning Step>

On the substrate on which the oxide semiconductor layer 12*s*1 covered by the first conductive layer 13*a* has been formed, a thickness of the first resist pattern 30 is reduced by ashing etc. so that, as shown in FIG. 8, the first conductive layer 13*a* other than the portions in which the source and drain electrodes are to be formed is exposed through the first resist pattern 30, and the resist pattern is left only on the source lines 13*s*1 and the portions in which the source and drain electrodes are to be formed, whereby a second resist pattern 31 is formed. Thereafter, as shown in FIG. 9, the first conductive layer 13*a* is patterned by selective etching using the second resist pattern 31 as a mask, whereby the source electrodes 13*sd* and the drain electrodes 13*dd* are formed. Thereafter, the second resist pattern 31 is removed using resist stripping solution or by ashing, etc.

<Third Patterning Step>

An insulating film of, for example, silicon oxide ($SiO_x$), silicon nitride ($SiN_x$), or silicon oxynitride ($SiO_xN_y$ (x>y)), or a multilayer film thereof (e.g., thickness: about 100-500 nm), is formed by CVD to form the gate insulating film 15 on the substrate on which the source lines 13*s*1, the source electrodes 13*sd*, and the drain electrodes 13*dd* have been formed.

Next, a third resist pattern is formed using a second photomask on the gate insulating film 15 other than portions in which contact holes are to be formed, i.e., other than portions each of which overlaps at least a portion of the corresponding drain electrode 13dd. Thereafter, as shown in FIG. 10, the contact holes 15h are formed in the gate insulating film 15 by patterning the gate insulating film 15 by selective etching using the third resist pattern as a mask. Thereafter, the third resist pattern is removed using resist stripping solution or by ashing, etc.

<Fourth Patterning Step>

As shown in FIG. 11, a transparent conductive film (second conductive film) 16 (e.g., thickness: about 50-200 nm) of, for example, ITO, IZO, etc., and a light-blocking metal film (third conductive film) 17 (e.g., thickness: about 50-300 nm) of, for example, a metal film of a metal (e.g., aluminum (Al), tungsten (W), molybdenum (Mo), tantalum (Ta), chromium (Cr), titanium (Ti), copper (Cu), etc.) or an alloy or nitride thereof, or a multilayer film thereof, are successively formed by sputtering to form a second multilayer film 18 including the transparent conductive film 16 and the light-blocking metal film 17 on the substrate on which the gate insulating film 15 has been formed.

Next, as shown in FIG. 12, a fourth resist pattern 32 which is thicker in portions in which gate lines and gate electrodes are to be formed than other portions (i.e., portions in which pixel electrodes are to be formed) is formed on portions of the second multilayer film 18 on which gate lines, gate electrodes, and pixel electrodes are to be formed, using a halftone or gray-tone mask (multitone mask) as a third photomask. Thereafter, as shown in FIG. 13, the second multilayer film 18 is patterned by selective etching using the fourth resist pattern 32 as a mask, to form the gate lines 18g1, the gate electrodes 18gd, and the pixel electrodes 16pd covered by a second conductive layer 17a and connected through the contact holes 15h to the drain electrodes 13dd, and form the TFTs 20 and the holding capacitor elements 21. In this case, the transparent conductive film 16 and the light-blocking metal film 17 may be simultaneously patterned by simultaneously etching, or may be successively patterned by successively etching from the upper layer.

<Fifth Patterning Step>

As shown in FIG. 14, a thickness of the fourth resist pattern 32 on the substrate on which the gate lines 18g1, the gate electrodes 18gd, and the pixel electrodes 16pd covered by the second conductive layer 17a, have been formed, is reduced by ashing etc., whereby the second conductive layer 17a on the pixel electrodes 16pd is exposed, and a fifth resist pattern 33 is formed while leaving the resist pattern only on the gate lines 18g1 and the gate electrodes 18gd. Thereafter, as shown in FIG. 15, the second conductive layer 17a is removed by selective etching using the fifth resist pattern 33 as a mask to expose the pixel electrodes 16pd. Thereafter, as appropriate, the fifth resist pattern 33 is removed using resist stripping solution or by ashing, etc.

Thus, the TFT substrate 10 can be manufactured using the three photomasks.

<Counter Substrate Manufacturing Process>

Initially, for example, a black-colored photosensitive resin is applied by spin coating or slit coating on an insulating substrate (e.g., a glass substrate etc.), and thereafter, the applied film is exposed to light using a photomask and then developed, whereby a black matrix is formed.

Next, a red-, green-, or blue-colored negative acrylic photosensitive resin is applied on the substrate on which the black matrix has been formed, and thereafter, the applied film is exposed to light through a photomask and then developed, whereby a color layer with a selected color (e.g., a red color layer) is formed. Moreover, by repeating a similar process, color layers with the two other colors (e.g., a green color layer and a blue color layer) are formed. As a result, a color filter is formed.

Next, a transparent conductive film of, for example, ITO, IZO, etc. is formed by sputtering on the substrate on which the color filter has been formed, to form a common electrode. Thereafter, a positive phenol novolac photosensitive resin is applied by spin coating on the substrate on which the common electrode has been formed, and the applied film is exposed to light through a photomask and then developed to form the photospacers.

Thus, the counter substrate 50 can be manufactured.

<Attachment Process>

Initially, polyimide resin is applied by a printing technique on a surface of the TFT substrate 10, and thereafter, baking and optionally rubbing are performed on the applied film, to form the alignment film 55. The alignment film 56 is formed on a surface of the counter substrate 50 in a manner similar to that of the TFT substrate 10.

Next, the sealing member 51 of an ultraviolet and thermal curing resin etc. is formed or drawn in the shape of a rectangular frame using a dispenser etc. on the surface of the counter substrate 50 on which the alignment film 56 has been provided. Next, a predetermined amount of a liquid crystal material is dropped to a region inside the sealing member 51 of the counter substrate 50.

Thereafter, the counter substrate 50 on which the liquid crystal material has been dropped and the TFT substrate 10 on which the alignment film 55 has been provided are attached together under reduced pressure. Thereafter, the two substrates attaced together (hereinafter referred to as a two-substrate structure) is exposed to the atmosphere so that pressure is applied to surfaces of the two-substrate structure. In this state, the sealing member 51 in the two-substrate structure is irradiated with ultraviolet (UV) light to preliminarily cure the sealing member 51, and then heated to completely cure the sealing member 51, whereby the TFT substrate 10 and the counter substrate 50 are bonded together.

Thereafter, the polarizing plates 57 and 58 are attached to opposite surfaces of the two-substrate structure, i.e., outer surfaces of the TFT substrate 10 and the counter substrate 50, respectively.

<Mounting Process>

An ACF is provided in the terminal region 10a of the two-substrate structure with the polarizing plates 57 and 58. Thereafter, the gate driver IC chips 53 and the source driver IC chips 54 are bonded to the terminal region 10a by thermocompression bonding with the ACF being interposed therebetween. Thus, the gate driver IC chips 53 and the source driver IC chips 54 are mounted on the two-substrate structure.

By the above processes, the liquid crystal display device S can be manufactured.

—Advantages of First Embodiment—

In the first embodiment, the entirety of each of the source lines 13s1, the entirety of each of the source electrodes 13sd, and the entirety each of the drain electrodes 13dd are provided on the corresponding one of the oxide semiconductor layers 12s1. Therefore, it is not likely that a break occurs in the oxide semiconductor layer 12s1 during the formation, so that a connection failure occurs between the source electrode 13sd and the drain electrode 13dd. Therefore, both the electrodes 13sd and 13dd and the oxide semiconductor layer 12s1 can be reliably connected together.

In addition, the TFT substrate 10 of the first embodiment can be manufactured using a single halftone or gray-tone mask (multitone mask) which serves both as a photomask for forming the source lines 13s1, the source electrodes 13sd, and the drain electrodes 13dd and as a photomask for forming the oxide semiconductor layer 12s1, and a single halftone or gray-tone mask (multitone mask) which serves both as a photomask for forming the gate lines 18g1 and the gate electrodes 18gd and as a photomask for forming the pixel electrodes 16pd.

Therefore, the TFT 20 formed of an oxide semiconductor having satisfactory characteristics can reliably operate normally, and the TFT substrate 10 including the TFTs 20 can be manufactured using as small as three photomasks at lower cost. As a result, the TFT substrate 10, and in addition, the liquid crystal display device S can be manufactured at lower cost without a decrease in manufacturing efficiency and yield.

<<Variations of First Embodiment>>

Figure 16:
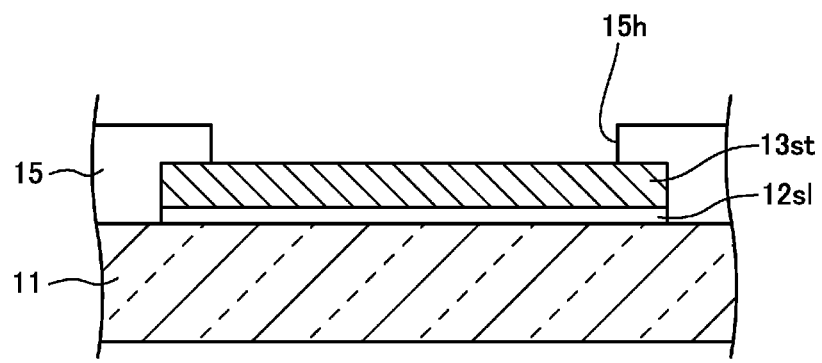
FIGS. 16(a)-16(c) are cross-sectional views showing a structure of a terminal portion (corresponding to FIG. 4(b)) of a source line of a TFT substrate according to a variation of the first embodiment.
Figure 16:
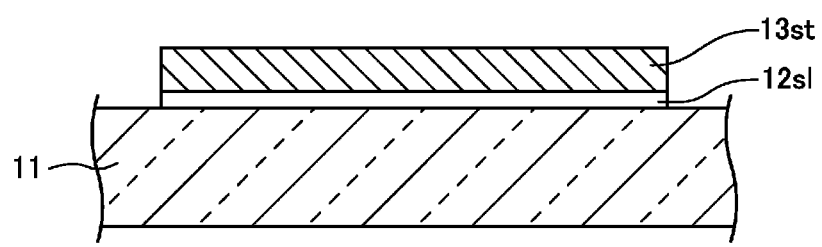
Figure 16:
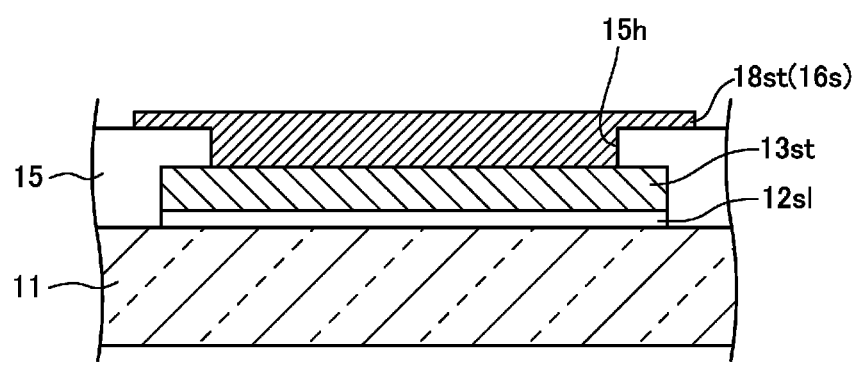
Figure 17:
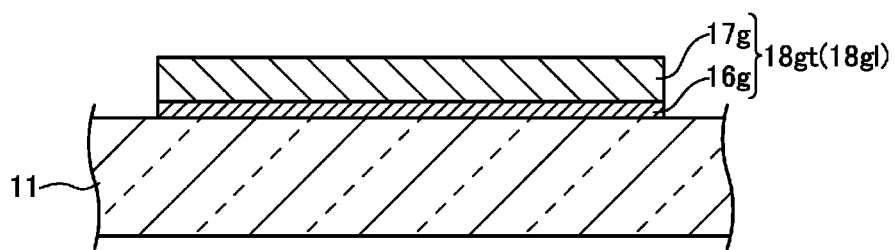
FIG. 17 is a cross-sectional view showing a structure of a terminal portion (corresponding to FIG. 4(c)) of a gate line of the TFT substrate of the variation of the first embodiment.

FIGS. 16(a)-16(c) are cross-sectional views showing a structure of a terminal portion of a source line 13s1 according to a variation of the first embodiment. FIG. 17 is a cross-sectional view showing a structure of a terminal portion of a gate line 18st according to a variation of the first embodiment.

In the first embodiment, the source terminal portion 13st is connected through the contact hole 15h to the source connection electrode 18st provided on the gate insulating film 15. The present invention is not limited to this. As shown in FIG. 16(a), the source terminal portion 13st may be partially exposed through the contact hole 15h formed in the gate insulating film 15 to directly form an electrode for electrically connecting to the source driver IC chip 54, i.e., may not be extended onto the gate insulating film 15 via another electrode.

Although, in the structure of the first embodiment shown in FIG. 4(b), the structure in which the contact hole 15h is formed so that a portion of the source terminal portion 13st is exposed, the contact hole 15h may be formed so that the entire source terminal portion 13st is exposed. Alternatively, as shown in FIG. 16(b), the source terminal portion 13st which is entirely exposed through the gate insulating film 15 may directly form an electrode for electrically connecting to the source driver IC chip 54.

In addition, as shown in FIG. 16(c), the source connection electrode 18st may be formed of only the transparent conductive layer 16s.

Although, in the structure of the first embodiment shown in FIG. 4(c), the gate terminal portion 18gt is formed on the gate insulating film 15, as shown in FIG. 17 the gate terminal portion 18gt may be formed directly on the insulating substrate 11.

Second Embodiment of the Invention

Figure 18:
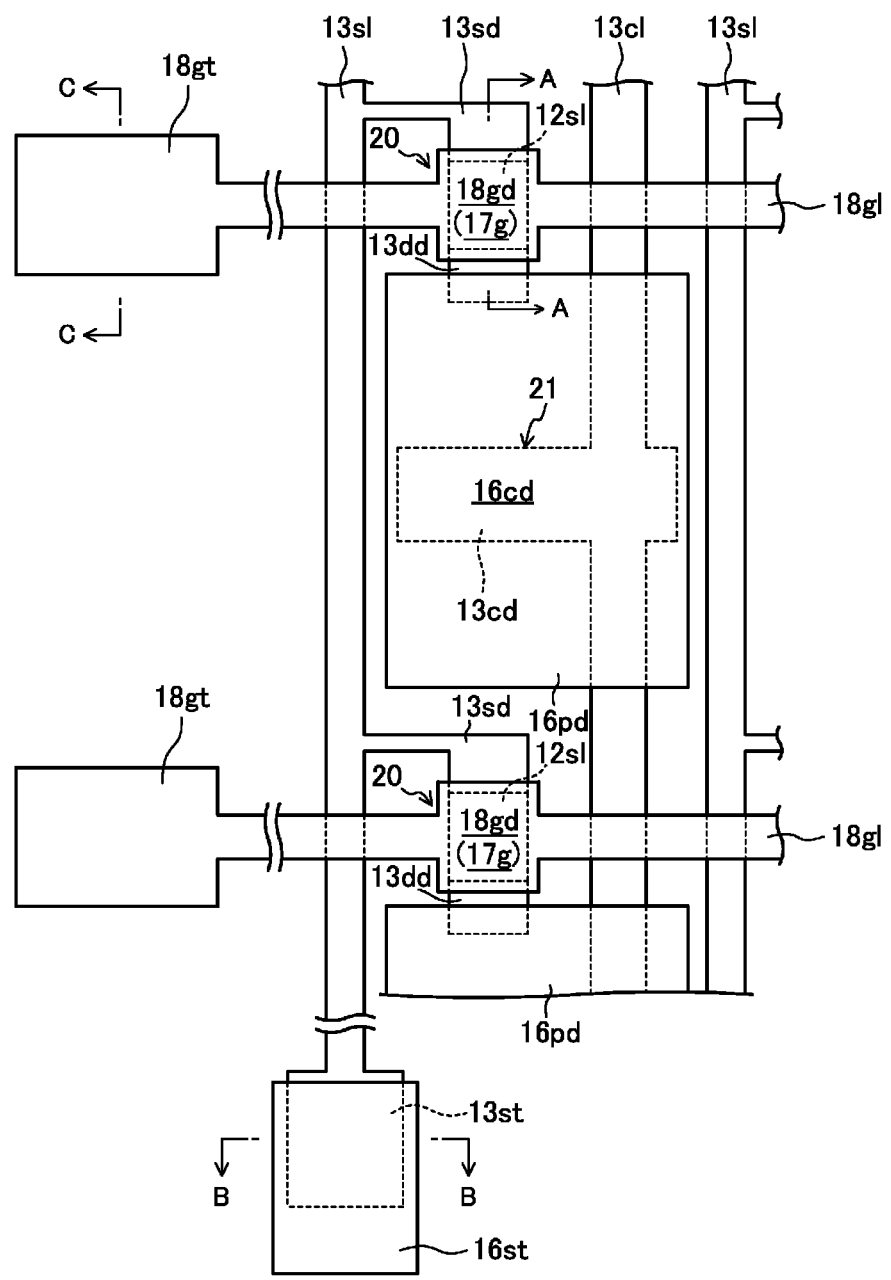
FIG. 18 is a plan view schematically showing a configuration of one pixel and a terminal portion of each line or interconnect, of a TFT substrate according to a second embodiment.

FIG. 18 is a plan view showing a configuration of one pixel and a terminal portion of each line or interconnect, of a TFT substrate 10 according to a second embodiment. FIG. 19(a) is a cross-sectional view showing a cross-sectional structure, taken along line A-A of FIG. 18. FIG. 19(b) is a cross-sectional view showing a cross-sectional structure, taken along line B-B of FIG. 18. FIG. 19(c) is a cross-sectional view showing a cross-sectional structure, taken along line C-C of FIG. 18. This embodiment has a configuration similar to that of the first embodiment, except for the configuration of the TFT substrate 10, and therefore, only the TFT substrate 10 having a different configuration will be described. Note that, in the embodiment below, the same parts as those of FIGS. 1-15 are indicated by the same reference characters and will not be described in detail.

Figure 19:
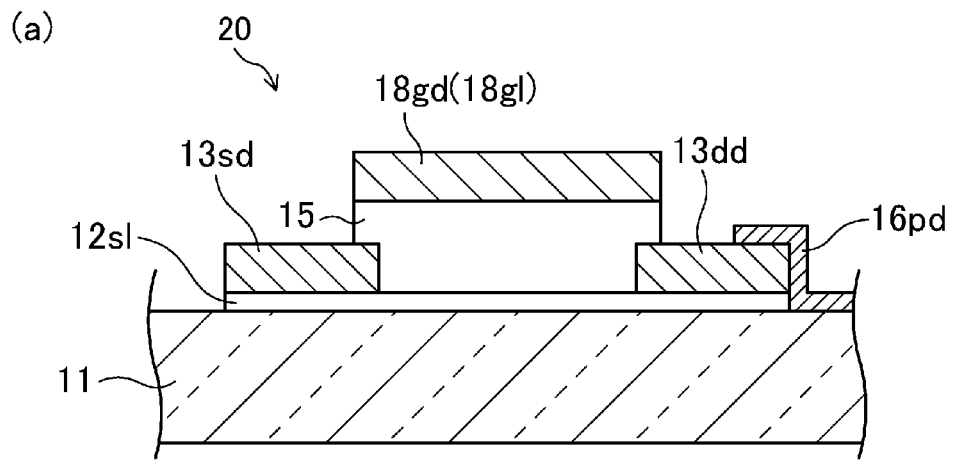
FIG. 19(a) is a cross-sectional view showing a cross-sectional structure, taken along line A-A of FIG. 18.
FIG. 19(b) is a cross-sectional view showing a cross-sectional structure, taken along line B-B of FIG. 18.
FIG. 19(c) is a cross-sectional view showing a cross-sectional structure, taken along line C-C of FIG. 18.
Figure 19:
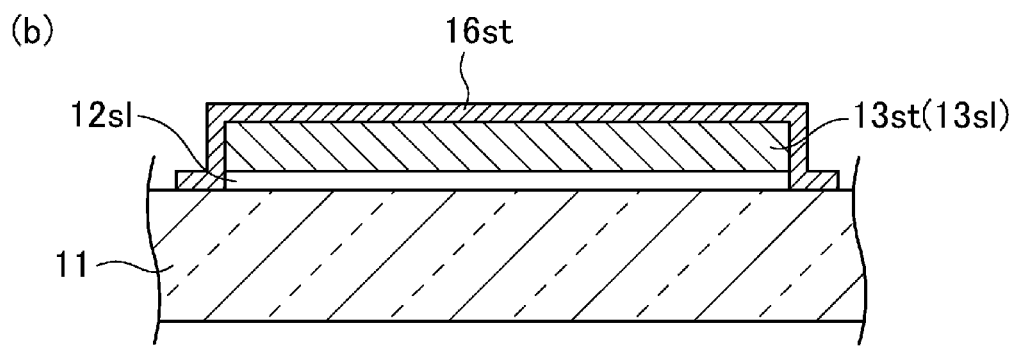
Figure 19:
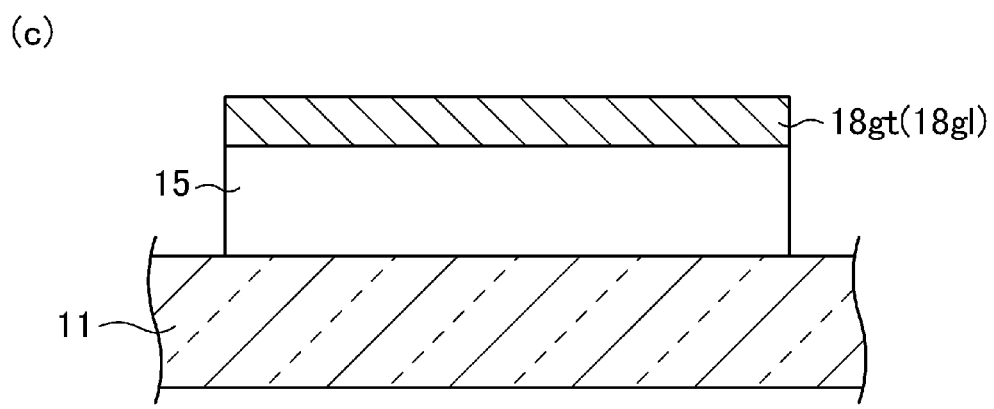

In the second embodiment, as shown in FIGS. 18 and 19, a gate line 18g1 (including a gate electrode 18gd) and a gate insulating film 15 have the same shape and are provided one on top of another on the insulating substrate 11 at the same location. With this configuration, as described in detail below, the gate lines 18g1, the gate electrodes 18gd, and the gate insulating film 15 can be formed using a single photomask.

As shown in FIG. 19(b), a source terminal portion 13st is covered by an island-shaped source connection electrode 16st formed of the same material as that of a pixel electrode 16pd. On the other hand, as shown in FIG. 19(c), a gate terminal portion 18gt is exposed on the gate insulating film 15 to directly form an electrode for electrically connecting to a gate driver IC chip 53.

—Manufacturing Method—

Figure 20:
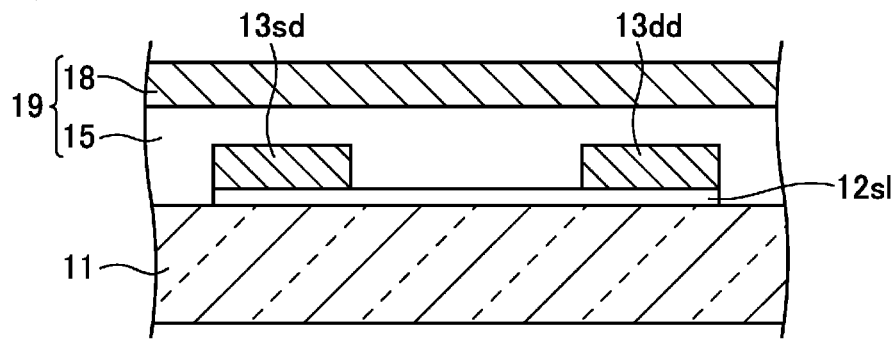
FIG. 20 is a cross-sectional view showing portions corresponding to FIG. 19 of the TFT substrate of the second embodiment in which a second multilayer film has been formed in a third patterning step in a method for manufacturing the TFT substrate.
Figure 20:
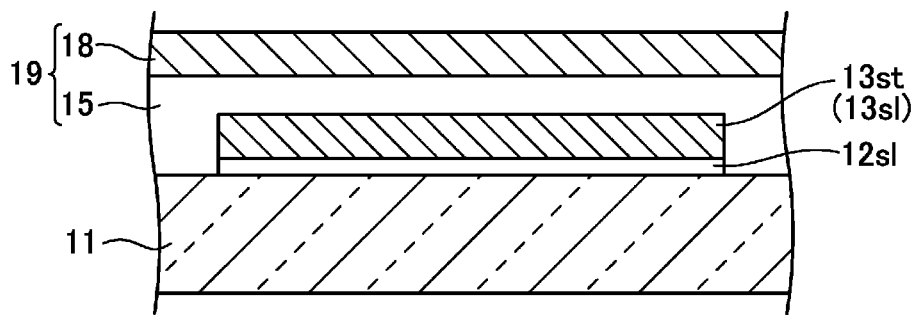
Figure 20:
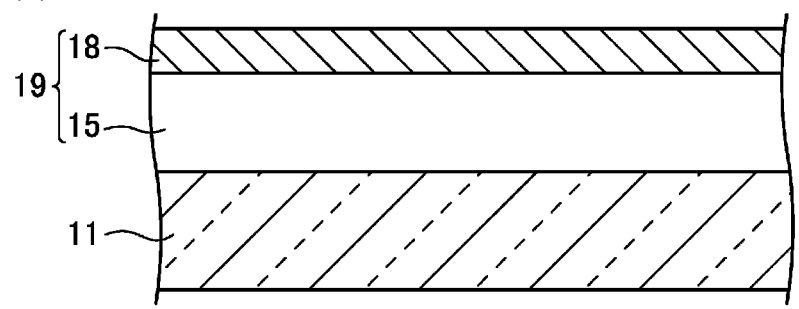
Figure 21:
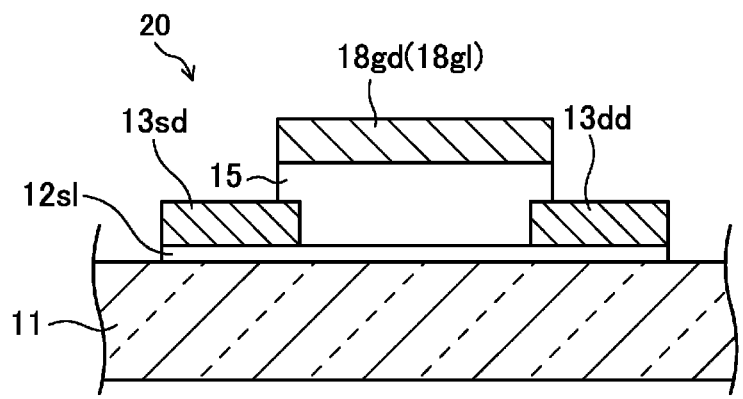
FIG. 21 is a cross-sectional view showing portions corresponding to FIG. 19 of the TFT substrate of the second embodiment in which a gate electrode and a gate insulating film have been formed in the third patterning step in the method for manufacturing the TFT substrate.
Figure 21:
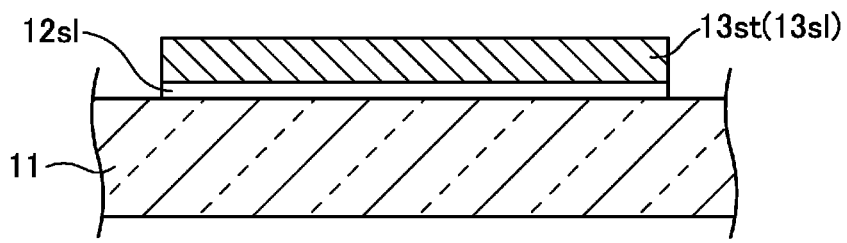
Figure 21:
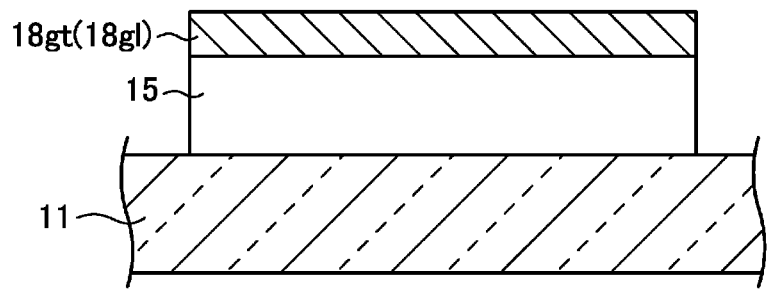

Next, a method for manufacturing the TFT substrate 10 of this embodiment will be described by way of example with reference to FIGS. 20 and 21. FIGS. 20 and 21 are cross-sectional views of parts of FIG. 19, showing a second patterning step. A TFT substrate manufacturing process of this embodiment includes first to fourth patterning steps. Note that the first and second patterning steps are similar to those of the first embodiment and will not be described in detail.

<Third Patterning Step>

An insulating film of, for example, silicon oxide ($SiO_x$), silicon nitride ($SiN_x$), or silicon oxynitride ($SiO_xN_y$ (x>y)), or a multilayer film thereof (e.g., thickness: about 100-500 nm), is formed by CVD to form the gate insulating film 15 on the substrate on which source lines 13s1, source electrodes 13sd, and drain electrodes 13dd have been formed.

Next, as shown in FIG. 20, a light-blocking metal film (second conductive film) 18 (e.g., thickness: about 50-300 nm) of, for example, a metal film of a metal (e.g., aluminum (Al), tungsten (W), molybdenum (Mo), tantalum (Ta), chromium (Cr), titanium (Ti), copper (Cu), etc.) or an alloy or nitride thereof, or a multilayer film thereof, is formed on the gate insulating film 15 by sputtering to form a second multilayer film 19 including the gate insulating film 15 and the light-blocking metal film 18.

Next, a third resist pattern is formed in portions of the second multilayer film 19 in which gate lines and gate electrodes are to be formed, using a second photomask. Thereafter, as shown in FIG. 21, the second multilayer film 19 is patterned by selective etching using the third resist pattern as a mask, and thereafter, the third resist pattern is removed using resist stripping solution or by ashing, etc., to form each of the gate lines 18g1 (including the corresponding gate electrode 18gd) and the gate insulating film 15 corresponding thereto which have the same shape and are provided one on top of another on the insulating substrate 11 at the same locations, and form TFTs 20. In this case, the light-blocking metal film 18 and the gate insulating film 15 may be simultaneously patterned by simultaneously etching, or may be successively patterned by successively etching from the upper layer.

<Fourth Patterning Step>

A transparent conductive film (third conductive film) 16 (e.g., thickness: about 50-200 nm) of, for example, ITO, IZO, etc. is formed by sputtering on the substrate on which the gate lines 18g1 and the gate electrodes 18gd have been formed.

Next, a fourth resist pattern is formed on portions of the transparent conductive film 16 in which pixel electrodes are to be formed, using a third photomask. Thereafter, the transparent conductive film 16 is patterned by selective etching using the fourth resist pattern as a mask to form the pixel electrodes 16pd and holding capacitor elements 21. Thereafter, as appropriate, the fourth resist pattern is removed using resist stripping solution or by ashing etc.

Thus, the TFT substrate 10 can be manufactured using the three photomasks.

—Advantages of Second Embodiment—

In the second embodiment, the gate line 18g1 (including the gate electrode 18gd) and the gate insulating film 15 are formed in the same shape and arranged one on top of another on the insulating substrate 11 at the same location. Therefore, the gate line 18g1, the gate electrode 18gd, and the gate insulating film 15 (i.e., different layers) can be simultaneously or successively formed together. Therefore, as in the first embodiment, the TFT substrate 10 can be manufactured using as small as three photomasks at lower cost. As a result, the TFT substrate 10, and in addition, the liquid crystal display device S can be manufactured at lower cost. Other advantages similar to those of the first embodiment can be obtained.

<<Variations of Second Embodiment>>

Figure 22:
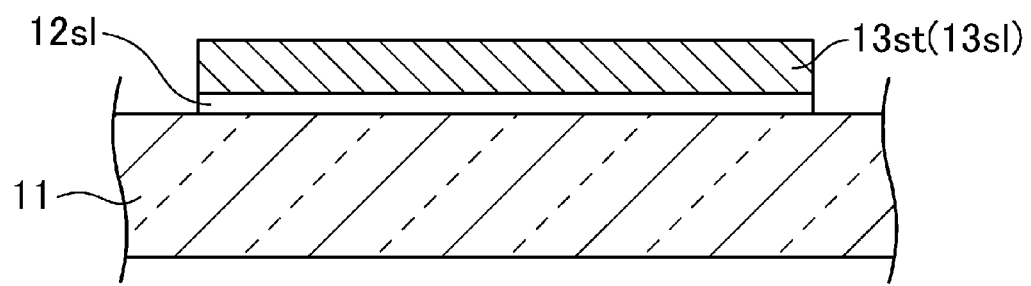
FIG. 22 is a cross-sectional view showing a structure of a terminal portion (corresponding to FIG. 19(b)) of a source line of a TFT substrate according to a variation of the second embodiment.
Figure 23:
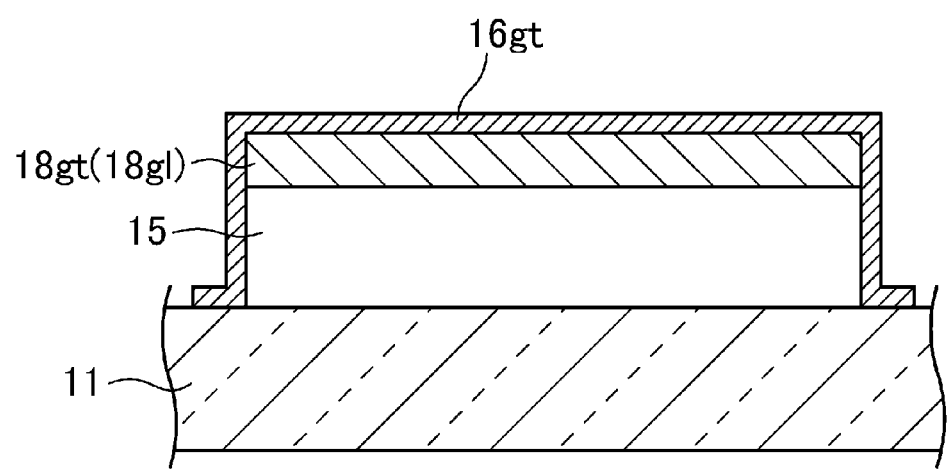
FIG. 23 is a cross-sectional view showing a structure of a terminal portion (corresponding to FIG. 19(c)) of a gate line of the TFT substrate of the variation of the second embodiment.

FIG. 22 is a cross-sectional view showing a structure of a terminal portion of a source line 13s1 according to a variation of the second embodiment. FIG. 23 is a cross-sectional view showing a structure of a terminal portion of a gate line 18g1 according to a variation of the second embodiment.

In the second embodiment, the source terminal portion 13st is covered by the source connection electrode 16st. Alternatively, as shown in FIG. 22, the source terminal portion 13st may not be covered by another electrode and may directly form an electrode for electrically connecting to the source driver IC chip 54.

In the second embodiment, the gate terminal portion 18gt is exposed on the gate insulating film 15. Alternatively, as shown in FIG. 23, the gate terminal portion 18gt may be covered by the island-shaped gate connection electrode 16gt of the same material as that of the pixel electrode 16pd.

Other Embodiments

In the first and second embodiments, the transmission type liquid crystal display device S has been described by way of example. The present invention is not limited to this. The present invention is applicable to transflective and reflection type liquid crystal display devices S.

For example, the transflective type liquid crystal display device of the present invention has a structure in which a reflection conductive layer is provided on a portion of each pixel electrode (transparent conductive layer) 16pd in the TFT substrate 10 of the first or second embodiment. The reflection conductive layer is formed of, for example, a reflective metal material, such as aluminum (Al), silver (Ag), etc.

The transflective type liquid crystal display device in which a reflection conductive layer is provided on each pixel electrode 16pd of the TFT substrate 10 of the first embodiment, may be manufactured as follows. In the fourth patterning step of the first embodiment, the fourth resist pattern 32 is formed to be thicker in a portion of the pixel electrode formation portion as well than in other portions. In the fifth patterning step, a thikness of the fourth resist pattern 32 is reduced to form the fifth resist pattern 33 on a portion of each pixel electrode 16pd as well, and the second conductive layer 17a is patterned by etching using the fifth resist pattern 33 as a mask, to form the reflection conductive layer on a portion of each pixel electrode 16pd. Alternatively, after the fifth patterning step of the first embodiment, the reflection conductive layer may be formed by photolithography separately from the gate lines 18g1 and the pixel electrodes 16pd.

The transflective type liquid crystal display device in which the reflection conductive layer is provided on the pixel electrodes (transparent conductive layer) 16pd in the TFT substrate 10 of the second embodiment, may be manufactured by forming the reflection conductive layer on a portion of each pixel electrode 16pd by photolithography after the fourth patterning step of the second embodiment.

In the reflection type liquid crystal display device of the present invention, for example, the pixel electrodes 16pd are formed of a reflective conductive material, such as aluminum (Al), silver (Ag), etc., instead of a transparent conductive material, in the TFT substrate 10 of the first or second embodiment.

The reflection type liquid crystal display device in which the pixel electrodes 16pd are formed of a reflective metal material in the TFT substrate 10 of the first or second embodiment may be manufactured as follows. In the fourth patterning step of the first or second embodiment, a reflective conductive film of aluminum (Al), silver (Ag), etc. may be formed instead of the transparent conductive film 16, and may be patterned in a manner similar to that of the transparent conductive film 16.

In addition, the present invention is not limited to liquid crystal display devices, and can be widely applied to other display devices, such as electroluminescence (EL) display devices, plasma display devices, etc., and electronic devices including TFTs.

Preferred embodiments and variations of the present invention have been described above. The scope of the present invention is not limited to that of the above embodiments and variations. The above embodiments and variation are for illustrative purposes only. Those skilled in the art will understand that there may be further variations of the combination of the parts and the processes, and these variations are within the scope of the present invention.

INDUSTRIAL APPLICABILITY

As described above, the present invention is useful for TFT substrates and display devices including TFT substrates, and methods for manufacturing TFT substrates. In particular, the present invention is suitable for a TFT including an oxide semiconductor which has satisfactory characteristics and can reliably operate normally, and a TFT substrate including the TFTs which needs to be manufactured using a smaller number of photomasks at lower cost, a display device including such a TFT substrate, and a method for manufacturing such a TFT substrate.

DESCRIPTION OF REFERENCE CHARACTERS

| | |
|---|---|
| S | LIQUID CRYSTAL DISPLAY DEVICE |
| 10 | TFT SUBSTRATE (THIN FILM TRANSISTOR SUBSTRATE) |
| 11 | INSULATING SUBSTRATE (BASE SUBSTRATE) |
| 12sl | OXIDE SEMICONDUCTOR LAYER |
| 13sl | SOURCE LINE |
| 13sd | SOURCE ELECTRODE |
| 13dd | DRAIN ELECTRODE |
| 15 | GATE INSULATING FILM |
| 16pd | PIXEL ELECTRODE |
| 16g | TRANSPARENT CONDUCTIVE LAYER |
| 17g | LIGHT-BLOCKING METAL LAYER |
| 18gl | GATE LINE |
| 18gd | GATE ELECTRODE |
| 20 | THIN FILM TRANSISTOR (TFT) |
| 30 | FIRST RESIST PATTERN |
| 31 | SECOND RESIST PATTERN |
| 32 | FOURTH RESIST PATTERN |
| 33 | FIFTH RESIST PATTERN |

The invention claimed is:

1. A method for manufacturing a thin film transistor substrate including: a base substrate; source lines provided on the base substrate and extending in parallel to each other; gate lines extending in parallel to each other in a direction intersecting the source lines; thin film transistors, pixel electrodes, semiconductor layers, source electrodes, drain electrodes, and gate electrodes, wherein at each intersection portions of the source lines and the gate lines, there is one of the thin film transistors and one of the pixel electrodes, each of the thin film transistors including one of the semiconductor layers of an oxide semiconductor, one of the source electrodes and one of the drain electrodes provided on the one of the semiconductor layers and separated from each other, a gate insulating film covering the semiconductor layers between the source and drain electrodes, and one of the gate electrodes provided over the one of the semiconductor layers with the gate insulating film being interposed between the one of the gate electrodes and the one of the semiconductor layers, each of the source electrodes being integrally formed with a corresponding one of the source lines, each of the gate electrodes being integrally formed with a corresponding one of the gate lines, and each of the semiconductor layers extending below the corresponding one of the source lines, and an entirety of each of the source lines, an entirety of each of the source electrodes, and an entirety of each of the drain electrodes being provided on a corresponding one of the semiconductor layers, the method comprising:

a first patterning step of successively forming a semiconductor film of an oxide semiconductor and a first conductive film on the base substrate to form a first multilayer film, forming, on a semiconductor layer formation portion of the first multilayer film, a first resist pattern which is thicker in portions in which the source lines, the source electrodes, and the drain electrodes are to be formed than in other portions, using a multitone mask as a first photomask, and thereafter, patterning the first multilayer film using the first resist pattern as a mask, thereby forming the source lines and the semiconductor layers to be covered by a first conductive layer wherein the first conductive layer is integrated with the source lines;

a second patterning step of reducing a thickness of the first resist pattern to expose a portion of the first conductive layer in an area other than where the source electrodes and the drain electrodes are to be formed while leaving first the resist pattern only on the source lines and the portions in which the source and drain electrodes are to be formed, thereby forming a second resist pattern, and thereafter, patterning the first conductive layer using the second resist pattern as a mask, to form the source and drain electrodes;

a third patterning step of, after the second patterning step, forming the gate insulating film to cover the semiconductor layers, the source lines, the source electrodes, and the drain electrodes, and forming a third resist pattern on portions of the gate insulating film other than the drain electrodes, using a second photomask, and thereafter, patterning the gate insulating film using the third resist pattern as a mask, to form, in the gate insulating film, contact holes reaching the drain electrodes;

a fourth patterning step of successively forming a second conductive film and a third conductive film to cover the gate insulating film, thereby forming a second multilayer film, forming a fourth resist pattern which is thicker in portions in which the gate lines and the gate electrodes are to be formed than in other portions, using a multitone mask as a third photomask, and thereafter, patterning the second multilayer film using the fourth resist pattern as a mask, to form the gate lines, the gate electrodes, and the pixel electrodes, wherein the pixel electrodes are covered by a second conductive layer formed by a part of the third conductive film and connected through the contact holes to the drain electrodes; and a fifth patterning step of reducing a thickness of the fourth resist pattern to expose the second conductive layer on the pixel electrodes while leaving the fourth resist pattern only on the gate lines and the gate electrodes, thereby forming a fifth resist pattern, and thereafter, removing the second conductive layer using the fifth resist pattern as a mask, to expose the pixel electrodes.

2. The method of manufacturing the thin film transistor substrate of claim 1, wherein each of the pixel electrodes is connected to a surface of the drain electrodes of the thin film transistors through one of the contact holes formed in the gate insulating film, and the gate lines and the gate electrodes each have a multilayer structure including a conductive layer and another conductive layer layered on the conductive layer, wherein the conductive layer is made of the same material as the pixel electrodes.

3. The method of manufacturing the thin film transistor substrate of claim 2, wherein the another conductive layer has a same shape as the conductive layer.

4. The method of manufacturing the thin film transistor substrate of claim 2, wherein each of the semiconductor layers is formed of an oxide semiconductor of indium gallium zinc oxide.

* * * * *